(12) United States Patent
Hongo

(10) Patent No.: US 8,222,642 B2
(45) Date of Patent: Jul. 17, 2012

(54) FIELD-EFFECT TYPE TRANSISTOR HAVING TWO GATE ELECTRODES AND DISPLAY ELEMENT USING THE SAME

(75) Inventor: Hiroo Hongo, Tokyo (JP)

(73) Assignee: NEC Corporation, Tokyo (JP)

( * ) Notice: Subject to any disclaimer, the term of this patent is extended or adjusted under 35 U.S.C. 154(b) by 272 days.

(21) Appl. No.: 12/451,005

(22) PCT Filed: Apr. 16, 2008

(86) PCT No.: PCT/JP2008/057441
§ 371 (c)(1),
(2), (4) Date: Nov. 6, 2009

(87) PCT Pub. No.: WO2008/136270
PCT Pub. Date: Nov. 13, 2008

(65) Prior Publication Data
US 2010/0111505 A1 May 6, 2010

(30) Foreign Application Priority Data
Apr. 26, 2007 (JP) ................... 2007-117443

(51) Int. Cl.
*H01L 29/786* (2006.01)
(52) U.S. Cl. .................. 257/59; 257/E29.255
(58) Field of Classification Search ........ 257/59, 257/72, 259, E29.255
See application file for complete search history.

(56) References Cited

U.S. PATENT DOCUMENTS

| | | | | |
|---|---|---|---|---|
| 6,160,270 A * | 12/2000 | Holmberg et al. | ............... | 257/59 |
| 6,356,336 B2 * | 3/2002 | Maeda | .................... | 349/187 |
| 6,486,514 B2 * | 11/2002 | Jeong et al. | ................... | 257/350 |
| 6,630,686 B1 * | 10/2003 | Kim | ................. | 257/72 |
| 6,828,585 B2 * | 12/2004 | Ueda | ............... | 257/59 |
| 6,842,202 B2 * | 1/2005 | Sohn | ............... | 349/43 |
| 6,897,477 B2 * | 5/2005 | Shibata et al. | ............ | 257/59 |

(Continued)

FOREIGN PATENT DOCUMENTS
JP 7-321324 12/1995
(Continued)

OTHER PUBLICATIONS

Tanaka, et al., "Characteristics of Field-Induced-Drain (FID) Poly-Si TFT's with High On/Off Current Ratio", IEEE Transactions on Electron Devices vol. 39, No. 4, Apr. 1992, pp. 916-920 (Conventional Technique 1).

(Continued)

*Primary Examiner* — Nathan Ha
(74) *Attorney, Agent, or Firm* — McGinn IP Law Group, PLLC

(57) ABSTRACT

A field-effect type transistor has: a source electrode; a drain electrode being a metal electrode; a semiconductor layer provided to be in contact with both of the source electrode and the drain electrode; and a gate electrode provided to face at least a part of the semiconductor layer. The gate electrode has: a first gate electrode; and a second gate electrode provided closer to the drain electrode than the first gate electrode is. The second gate electrode is so connected as to have a same potential as the drain electrode and is electrically isolated from the first gate electrode. Consequently, in a display device, the off-leakage current is suppressed, and reduction in a pixel area and a bus interconnection width is suppressed.

14 Claims, 19 Drawing Sheets

U.S. PATENT DOCUMENTS

| | | | |
|---|---|---|---|
| 7,751,011 B2 * | 7/2010 | Ahn et al. | 349/141 |
| 7,960,720 B2 * | 6/2011 | Kamikawa et al. | 257/40 |
| 8,013,969 B2 * | 9/2011 | Ahn et al. | 349/141 |
| 2002/0158829 A1 | 10/2002 | Yamazaki et al. | |
| 2006/0061526 A1 | 3/2006 | Shirasaki et al. | |
| 2006/0065928 A1 | 3/2006 | Nagai | |
| 2006/0138416 A1 | 6/2006 | Park | |
| 2006/0139504 A1 * | 6/2006 | Ahn et al. | 349/42 |
| 2008/0121996 A1 | 5/2008 | Park et al. | |
| 2008/0188048 A1 | 8/2008 | Nagai | |
| 2009/0250704 A1 * | 10/2009 | Yamazaki et al. | 257/72 |

FOREIGN PATENT DOCUMENTS

| | | |
|---|---|---|
| JP | 9-129891 | 5/1997 |
| JP | 2002-31817 | 1/2002 |
| JP | 2002-328617 | 11/2002 |
| JP | 2003-84686 | 3/2003 |
| JP | 2003-202834 | 7/2003 |
| JP | 2003-332266 | 11/2003 |
| JP | 2005-64123 | 3/2005 |
| JP | 2006-86528 | 3/2006 |
| JP | 2006-91089 | 4/2006 |
| JP | 2006-100404 | 4/2006 |
| JP | 2006-184853 | 7/2006 |

OTHER PUBLICATIONS

Chang, et al., A Novel High-Performance Poly-Silicon Thin Film Transistor With a Self-Aligned Thicker Sub-Gate Oxide Near the Drain/Source Regions, IEEE Electron Device Letters vol. 22, No. 10, pp. 472-474, Oct. 2001 (Conventional Technique 2).

Appenzeller, et al., "Band-to-Band Tunneling in Carbon Nanotube Field-Effect Transistors", Physical Review Letters vol. 93, No. 19, pp. 196805-1-196805-4, Nov. 5, 2004 (Conventional Technique 3).

Park, et al., "Novel Offset Gated Poly-Si TFT's with Subgate", IEEE Transactions on Electron Devices, vol. 46, and No. 7, pp. 1402-1405, Jul. 1999 (Conventional Technique 4).

* cited by examiner

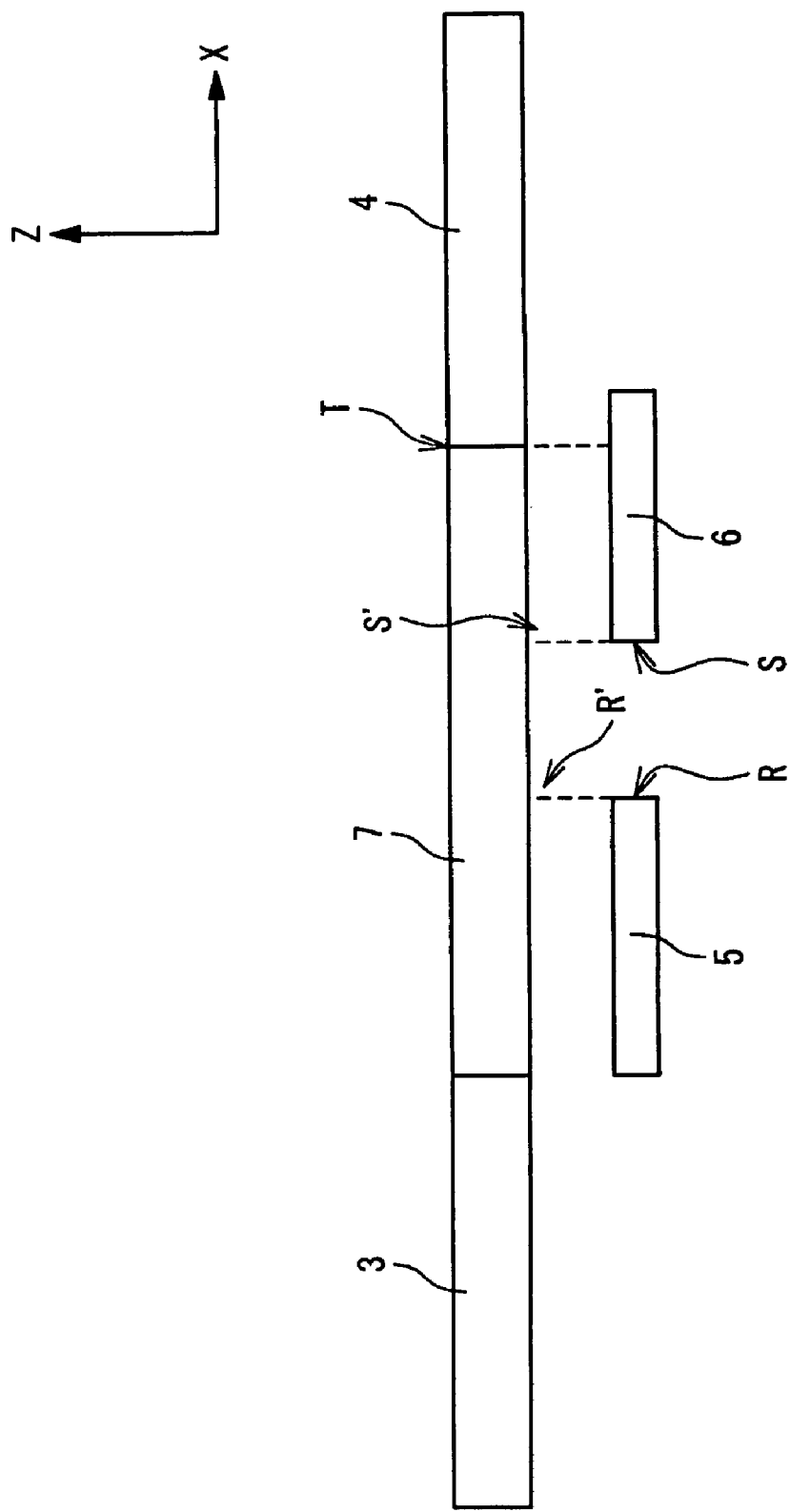

FIELD-EFFECT TYPE TRANSISTOR HAVING TWO GATE ELECTRODES AND DISPLAY ELEMENT USING THE SAME

TECHNICAL FIELD

The present invention relates to a display element of a display screen and a field-effect type transistor used in the display element. Moreover, it relates to an electronic device using the display element. This application is based upon and claims the benefit of priority from Japanese Patent Application No. 2007-117443, and the disclosure of Japanese Patent Application No. 2007-117443 is incorporated herein by reference.

BACKGROUND ART

A display device in which a display element is arranged for every pixel and that displays an image by ON/OFF controlling the each display element will be described below.

FIG. 1 shows a circuit diagram of one display element. As the display element, ones that use a liquid crystal, a light emitting device and the like are known. Here, as an example, the display element using liquid crystal will be explained. One of data (source) lines, one of gate lines, a transistor (TFT 200 (TFT: Thin Film Transistor)), a retention capacitor (Cs 300), and a pixel electrode A are provided for one display element (CLC 200 (CLC: Liquid Crystal Capacitor)) In the case of the liquid crystal display device, the pixel section is considered as a capacitor (CLC) in terms of an equivalent circuit.

A gate electrode (G) of the TFT 200 is connected to a gate line 2-2, a source region (S) thereof is connected to a data line 1-1, and a drain region (D) thereof is connected to a pixel electrode 10. One end of the Cs 300 is connected to the drain region (D) of the TFT 200 through the pixel electrode 10, and the other end thereof is connected to a gate line 2-2 of a gate line 2-1 of the previous stage.

It should be noted that the Cs 300 is not necessarily provided. Since the CLC 100 also is a capacitor, the CLC 100 alone may be enough for maintaining the voltage, depending on an embodiment of the pixel (the CLC 100) and the TFT 200. Moreover, the TFT 200 can be either a p-channel type or an n-channel type.

Regarding the display device thus configured, an operation when displaying an image will be explained below.

When a signal voltage is supplied to the gate line 2-2 at certain timing, electric potential of the gate electrode (G) of the TFT 200 varies and a gate voltage varies. Thereby, the TFT 200 becomes in a conductive state. While TFT 200 is maintained in the conductive state, a signal voltage is supplied to the data line 1-1 at certain timing. Then, electric potential of the drain electrode (D) of the TFT 200 that is conductive varies. Thus, electric potential of the pixel electrode 10 connected to the Cs 300 and the CLC 100 varies, and the Cs 300 and the CLC 100 are charged. A shutter is switched by the CLC 100 being charged, and optical transmittance varies. Thereby, display in this display pixel is performed. Here, even if the supply of the signal to the data line 1-1 and the gate line 2-2 is stopped before the liquid crystal shutter is completely switched, the liquid crystal shutter can be switched by a voltage retained by the Cs 300. It is therefore possible to supply the signal voltage to a data line and a gate line of the next pixel, without waiting until the liquid crystal shutter is completely switched. It should be noted that the other end of the Cs 300 (an electrode on the opposite side of the drain region (D)) is connected to the gate line 2-1 that is switched at the previous step (namely, of a pixel whose switching is completed). Therefore, the other end of the Cs 300 is always connected to the gate line 2-1 supply of the signal to whom is stopped, and thus it does not cause interference. Moreover, since the other end of the Cs 300 is connected to the gate line 2-1 of the previous stage, it is possible to decrease unnecessary interconnections.

The above-mentioned method where the switching transistor (TFT) is provided for each pixel is called an active matrix type. The active-matrix type display device is described, for example, in Japanese Laid-Open Patent Application No. 2006-91089, Japanese Laid-Open Patent Application No. 2006-184853, Japanese Laid-Open Patent Application No. 2002-328617, and Japanese Laid-Open Patent Application No. 2002-31817.

In the active-matrix type display device, how precise the display pixel (liquid crystal in the above-mentioned example) can be switched is important. Therefore, precision of the transistor that switches an electrical state of the display pixel determines gradation ability of the display device. Moreover, not only the gradation but also power consumption, an image quality and the like are greatly influenced by the performance of the switching transistor. For example, if a leakage current is caused in the transistor when the signal voltage is not supplied to the gate line and the data line, electric charges leak from the charged retention capacitor. Existence of the leakage current means that light is not completely cut off, which causes deterioration of the gradation ability. Moreover, in that case, the voltage for switching the display pixel also varies. Furthermore, in order to prevent this, it is necessary to input the same signal again with a short interval, which consumes excessive electric power. Moreover, charging need to be performed generously in consideration of the leakage current, which makes a charging time for one display element longer. As a result, it becomes necessary to increase an interval of switching the image for each frame, and for example, many missing scenes are caused in video. Therefore, a technique which can suppress the off-leakage current in the switching transistor in the OFF state is desired.

As the switching transistor used in the display element of the active-matrix type display device, a field-effect type transistor using a polycrystalline semiconductor thin film (hereinafter referred to as p-TFT) is known. The p-TFT is advantageous in that field effect mobility is large, as compared with a TFT using an amorphous semiconductor thin film (hereinafter referred to as a-TFT).

In order to suppress the off-leakage current in the p-TFT, it may be considered to employ a Lightly Doped Drain (LDD) structure, for example. This technique is a measure against the so-called short channel effect. By changing doping concentration with respect to a channel, an electric field applied to the channel layer is controlled such that the off-leakage current is suppressed. A technique employing the LDD structure is described, for example, in Japanese Laid-Open Patent Application No. 2005-64123 and Japanese Laid-Open Patent Application No. H09-129891.

As another technique for suppressing the off-leakage current, it may be considered to devise a structure of a gate electrode. By devising the structure of the gate electrode, an electric field applied to the semiconductor layer can be controlled. Such a transistor is described, for example, in Japanese Laid-Open Patent Application No. H07-321324, Japanese Laid-Open Patent Application No. 2006-100404, IEEE TRANSACTIONS ON ELECTRON DEVICES VOL. 39, NO. 4, p. 916 (Conventional Technique 1), IEEE ELECTRON DEVICE LETTERS, VOL. 22, NO. 10, p. 472 (Conventional Technique 2) and PHYSICAL REVIEW LETTERS VOL. 93, No. 19, p. 196805 (Conventional Technique 3).

In the Conventional Technique 1 among them, a transistor in which a sub-gate for controlling source/drain regions is provided on a main gate is described. In the Conventional Technique 1, it is described that the sub-gate is controlled by a sub-gate voltage Vs.

In the Conventional Technique 2, it is described that a metal that is electrically floating (being not connected/being not controlled) is provided as the sub-gate in the transistor. According to the Conventional Technique 2, the sub-gate plays a role of a doping mask, and impurity concentration in the channel layer immediately under the sub-gate is lowered. Thereby, the leakage current is suppressed as in the case of the LDD structure.

In the Conventional Technique 3, it is described that a gate electrode is divided and controlled by the same electric potential.

By the way, a transistor other than the p-TFT is also known as the transistor for the display device. For example, a transistor other than the p-TFT includes a transistor (hereinafter referred to as a CNT-FET) that uses carbon nanotube (CNT) as the semiconductor layer.

The CNT-FET has more merits than the p-TFT in that a high-temperature treatment process is not required in the manufacturing processes, a huge manufacturing apparatus is not necessary and so on. In a case of manufacturing the p-TFT, an annealing treatment that requires a high processing temperature is necessary during the manufacturing processes. Therefore, it is difficult to use low heat resistance material. Moreover, since it is basically manufactured by a vacuum apparatus such as a sputtering apparatus, a large-scale and expensive vacuum apparatus is necessary for manufacturing a large area display device. On the other hand, the CNT-FET can be manufactured by a coating method, a printing method and the like, because CNT can be dissolved in a solution. Therefore, a huge vacuum apparatus is not required in manufacturing the CNT-FET and thus the manufacturing cost can be greatly suppressed. Moreover, since a high-temperature treatment is not necessary, low heat resistance material such as a plastic substrate can be used as a base substrate, which makes it possible to manufacture a flexible display device.

FIG. 2 is a schematic cross-sectional view showing an example of a typical CNT-FET. As shown in FIG. 2, the CNT-FET has a gate electrode 105, a source electrode 103, a drain electrode 104, a semiconductor layer 107 and a pixel electrode 110 that are formed on a substrate 109. The gate electrode 105 is formed in contact with the substrate 109 and is covered by a gate insulating film 112. The semiconductor layer 107 is formed on the gate insulating film 112 so as to face the gate electrode 105 across the gate insulating film 112. The semiconductor layer 107 is a layer including CNT. The source electrode 103 and the drain electrode 104 are formed on both ends of the semiconductor layer 107. The source electrode 103 and the drain electrode 104 are usually metal electrodes. A protection film 111 is so provided as to cover the source electrode 103, the drain electrode 104 and the semiconductor layer 107. Moreover, the pixel electrode 110 is formed on a part of the protection film 111. The pixel electrode 110 is connected to the drain electrode 104 through an aperture provided in a part of the protection film 111.

The CNT-FET is manufactured through the following processes (1) to (5). (1) Making a surface of a substrate insulating. If a substrate is insulating, it can be used as it is. (2) Forming the gate electrode 105. (3) Forming the gate insulating film 112. (4) Forming electrodes to be the source electrode 103 and the drain electrode 104. (5) Printing and coating material to be the semiconductor layer 107. The above is the most fundamental processes. As an alternative method, the order of (1) to (5) may be changed to an order of (1), (5), (4), (3) and (2). Moreover, an order of (1), (2), (3), (5) and (4) also is possible. In either case, the protection film 111 and the like are formed at the end.

In the CNT-FET shown in FIG. 2, the gate electrode 105 and the semiconductor layer 107 form a capacitor across the gate insulating film 112. By controlling a voltage of the gate electrode 105, it is possible to change a voltage (electric potential, potential) of a part of the semiconductor layer 107. By changing the electric potential of the part of the semiconductor layer 107, it is possible to control electric charge density or energy barrier in the semiconductor layer 107. That is to say, the amount of current flowing through the semiconductor layer 107 can be controlled by controlling the gate voltage. This is the same operation as in the case of a typical silicon-type field-effect transistor.

Such a CNT-FET is described, for example, in IEEE TRANSACTIONS ON ELECTRON DEVICES, VOL. 46, and NO. 7, p. 1402 (Conventional Technique 4).

The LDD structure is useful for such a transistor as the p-TFT using a silicon film as the semiconductor layer wherein the doping method is established. However, it is difficult to apply the LDD structure to material (for example, CNT-FET) wherein the doping method is not yet established.

Moreover, even if the structure of the gate electrode of a transistor other than the p-TFT is devised as in the above-mentioned document, the leakage current is not necessarily suppressed. For example, even if the structure in which a plurality of gate electrodes are stacked as in the Conventional Technique 2 is applied to the CNT-FET, the leakage current is not necessarily suppressed. In fact, according to the Conventional Technique 4 whose structure is similar to that of the Conventional Technique 1, it is described that the leakage current clearly exists when the gate voltage is positive.

The reason why the conventional sub-gate structure is not effective for the leakage current in the transistor other than the p-TFT is considered to be that there are different principles of the leakage current as compared with the case of the p-TFT. In the case of the CNT-FET, for example, charge transfer in a Schottky junction portion between the semiconductor layer and the drain electrode is considered to be the cause of the leakage current. In a case of a p-type CNT-FET, holes (majority carriers) are injected from the source side. Ideally, when the gate voltage is positive, a potential of the channel in the gate region rises and hence the current is prevented. In fact, however, when the gate voltage is positive, electrons (minority carriers) are injected from the drain side, which causes the leakage current. In the case of the CNT-FET, influence of the Schottky junction portion on the leakage current is larger, because the Schottky barrier for the minority carriers on the drain side is not so high and the Schottky barrier is lowered by the gate voltage at the time of the OFF operation. Incidentally, the reason why the Schottky barrier of the CNT is small is that a band gap of the CNT is small (for example, in a case where a diameter of CNT is 0.7 to 2 nm, the band gap is 0.4-1.2 eV). The same applies to a case of an n-type CNT-FET, wherein respective carriers are replaced complimentarily.

It is therefore desired to achieve a technique that can suppress the leakage current caused by the Schottky junction portion.

In the display device, it is necessary to ensure an effective area of the pixel section. For example, when the sub-gate is controlled electrically independently as described in the Conventional Technique 2, the voltage applied to the channel layer may be effectively controlled. In this case, however, an interconnection for controlling the sub-gate is necessary in addition to an interconnection connected to a main gate line. Due to this interconnection for controlling the sub-gate, the effective area of the pixel section is decreased. The decrease in the effective pixel area means reduction in brightness ability.

It is therefore desired to achieve a technique that can suppress the leakage current without decreasing the effective pixel area.

DISCLOSURE OF INVENTION

Therefore, an object of the present invention is to provide a technique that can suppress the leakage current caused by the Schottky junction portion. Another object of the present invention is to provide a technique that can suppress the leakage current with maintaining the effective pixel area.

A field-effect type transistor of the present invention has: a source electrode; a drain electrode being a metal electrode; a semiconductor layer provided between the source electrode and the drain electrode in an X-direction and being in contact with both of the source electrode and the drain electrode; and a gate electrode so provided as to face at least a part of the semiconductor layer in a Z-direction perpendicular to the X-direction. The gate electrode has: a first gate electrode; and a second gate electrode provided closer to the drain electrode in the X-direction than the first gate electrode is. The second gate electrode is so connected as to have a same potential as the drain electrode and is electrically isolated from the first gate electrode.

It is preferable that at least a part of the second gate electrodes is so provided as to face in the Z-direction a connection portion between the semiconductor layer and the drain electrode.

Regarding the first gate electrode 5, it is preferable that an end portion of the first gate electrode 5 on a side of the drain electrode 4 is provided at a position facing a central portion of a channel region formed in the semiconductor layer.

It is preferable that the source electrode has a rectangular portion and the drain electrode is so provided as to surround three sides of the rectangular portion.

It is preferable that the semiconductor layer includes carbon nanotube.

A display element of the present invention has: the above-described field-effect type transistor: and a pixel electrode electrically connected to the drain electrode.

In an embodiment of the display element, the pixel electrode is a liquid crystal electrode.

In another embodiment of the display element, the pixel electrode is an EL (electroluminescence) element.

It is preferable that the second gate electrode is electrically connected to the pixel electrode so as to have the same potential as the drain electrode.

It is preferable that the display element of the present invention further has a retention capacitor connected to the pixel electrode.

Still another embodiment of the display element of the present invention has: a switching transistor; a current driving transistor; and a pixel electrode connected to a drain electrode of the current driving transistor. A drain electrode of the switching transistor is electrically connected to a gate electrode of the current driving transistor. At least one of the switching transistor and the current driving transistor is the above-described field-effect type transistor.

It is preferable that a source electrode of the switching transistor is electrically connected to a data line and a source electrode of the current driving transistor is connected to a current supply line different from the data line.

It is preferable that the above-mentioned display element further has a retention capacitor connected to the switching transistor. In this case, the drain electrode of the switching transistor is electrically connected to one of two electrodes of the retention capacitor.

A video camera of the present invention has: an imaging unit; a display screen; and a display control unit configured to control such that an image data acquired by the imaging unit is displayed on the display screen. In the display screen, a plural number of the above-mentioned display elements are arranged in a grid form.

An optical disk reproducing device of the present invention has: an optical disk reading unit configured to read information recorded on an optical disk; a display screen; and a display control unit configured to control such that the information read by the optical disk reading unit is displayed on the display screen. In the display screen, a plural number of the above-mentioned display elements are arranged in a grid form.

A television receiver of the present invention has: a reception unit configured to receive a television video signal; a display screen; and a display control unit configured to control contents displayed on the display screen based on the television video signal received by the reception unit. In the display screen, a plural number of the above-mentioned display elements are arranged in a grid form.

A head mounted display of the present invention has: a display screen; a supporting part configured to support the display screen such that, when used, the display screen is positioned in front of eyes of a user; and a display control unit configured to control contents displayed on the display screen. In the display screen, a plural number of the above-mentioned display elements are arranged in a grid form.

According to the present invention, a technique that can suppress the leakage current caused by the Schottky junction portion is provided. Furthermore, a technique that can suppress the leakage current with maintaining the effective pixel area is provided.

BRIEF DESCRIPTION OF DRAWINGS

Objects, effects and features of the present invention will be more apparent from the following description of certain embodiments taken in conjunction with the attached drawings.

FIG. 11 is a conceptual diagram of the AA' cross section in FIG. 4 for explaining an arrangement of a gate electrode.

BEST MODE FOR CARRYING OUT THE INVENTION

Figure 1:
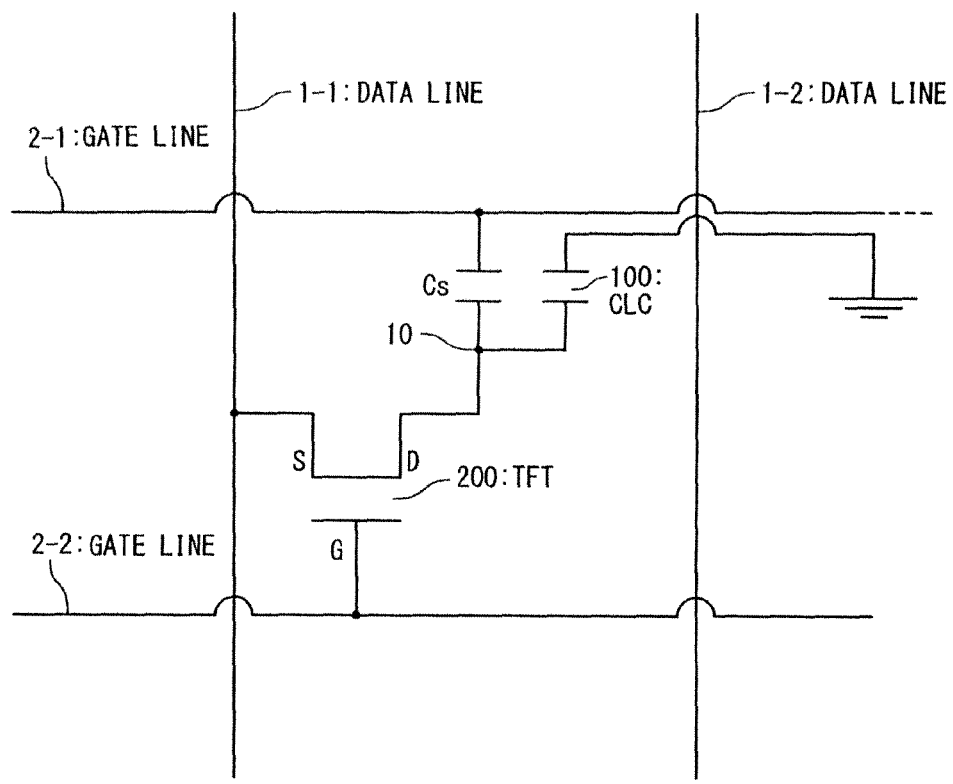
FIG. 1 is a circuit diagram of a display element.

Embodiments of a display device according to the present invention will be described below with reference to the attached drawings. In the drawings, the same or similar reference numeral indicates the same, similar or equivalent component.

First Embodiment

An embodiment of the present invention will be described in detail with reference to the drawings. In the present embodiment, a case where liquid crystal is used as a display pixel will be described.

Figure 3:
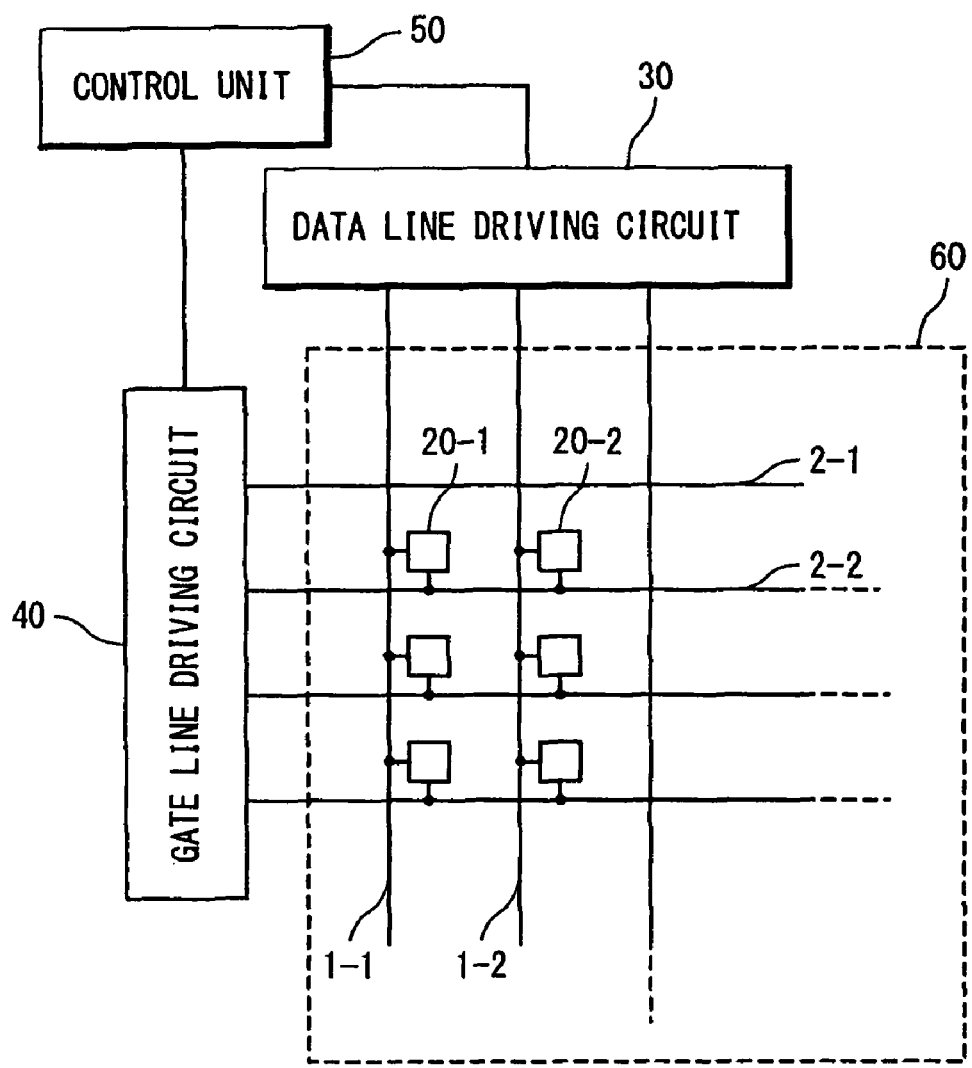
FIG. 3 is a schematic configuration diagram of a display device of a first embodiment.

FIG. 3 is a schematic diagram showing a configuration of a display device using a display element 20 according to the present invention. The display device has a control unit 50, a data line driving circuit 30, a gate line driving circuit 40 and a display screen 60. In the display screen 60, a plurality of data lines 1-1, 1-2 . . . (hereinafter collectively referred to as data lines 1 when not distinguished from each other) and a plurality of gate lines 2-1, 2-2 . . . (hereinafter collectively referred to as gate lines 2 when not distinguished from each other) are formed in a grid form. Moreover, display elements 20-1, 20-2 . . . (hereinafter collectively referred to as display elements 20) of the present invention are provided at respective intersections of the plurality of data lines 1 and the gate lines 2.

The data line driving circuit 30 is a circuit for supplying signal voltages to the plurality of data lines 1. The gate line driving circuit 40 is a circuit for supplying signal voltages to the plurality of gate lines 2. The data line driving circuit 30 and the gate line driving circuit 40 are connected to the control unit 50 and are controlled by the control unit 50.

The control unit 50 is provided with, for example, a CPU, a RAM, a ROM and the like that are not shown. The control unit 50 controls operations of the data line driving circuit 30 and the gate line driving circuit 40 by an installed program for display control being executed by the CPU. Thereby, a desired image can be displayed on the display screen 60.

Figure 4:
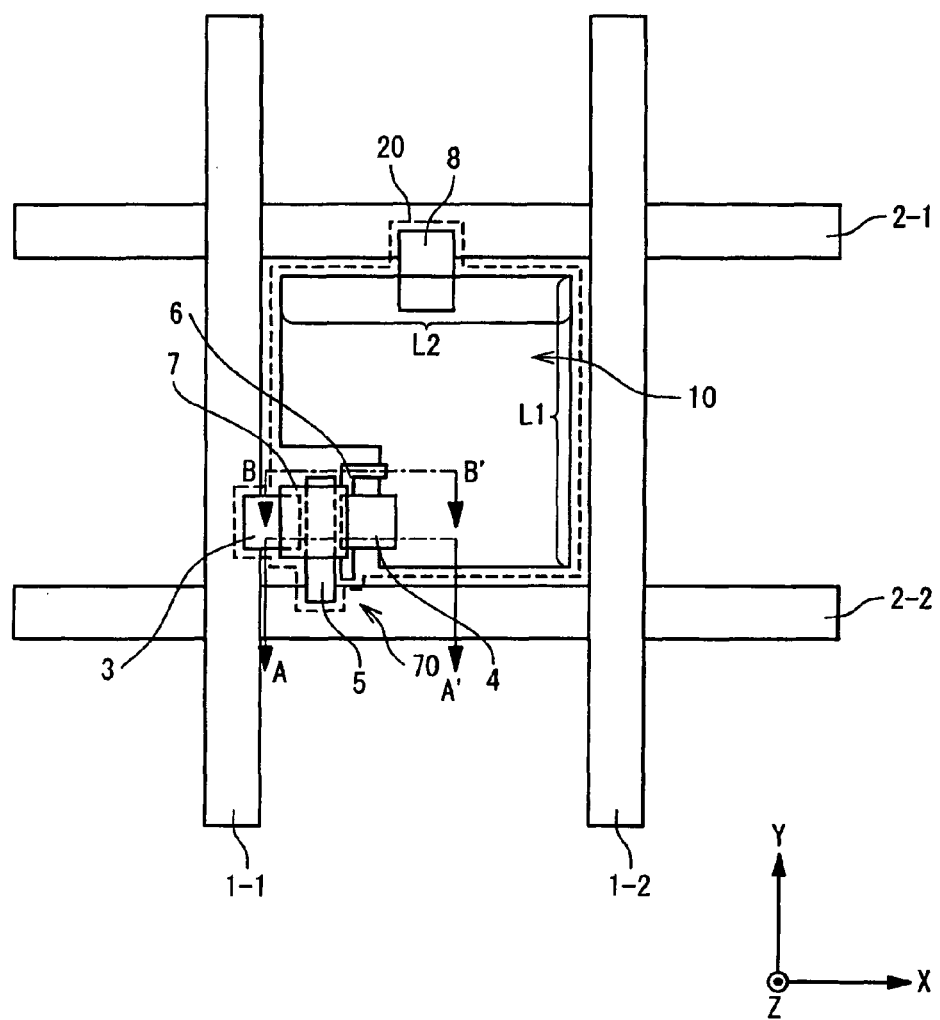
FIG. 4 is a plan view showing a configuration of a display element according to the first embodiment.

A configuration of the display element 20 will be explained referring to FIG. 4. FIG. 4 is a plan view schematically showing a configuration of the display element 20. Note that, although the configuration illustrated in FIG. 4 cannot be actually seen through because it is covered with a protection film and the like, it is shown as is seen though for convenience of explanation.

In the intersection region of the data line 1 and the gate line 2 in FIG. 4, an insulating film intervenes between the data line 1 and the gate line 2 to isolate them from each other. The data line 1 and the gate line 2 are each formed with an ITO transparent electrode formed to have a thickness of about 1.5 [μm], for example. As the insulating film that insulates the data line 1 and the gate line 2, a silicon nitride film having a thickness of 0.4 [μm] can be used, for example.

The display element 20 is provided in a region surrounded by the data lines 1-1, 1-2 and the gate lines 2-1, 2-2. The display element 20 has a switching element 70, a display pixel not shown, a pixel electrode 10 connected to the display pixel, and a retention capacitor. The gate line 2-2 and an electrode 8 of the retention capacitor are electrically connected to each other. The electrode 8 of the retention capacitor faces the pixel electrode 10 across an insulating film (not shown), and thereby, the retention capacitor is formed.

The switching element 70 has a source electrode 3, a drain electrode 4, a first gate electrode 5, a second gate electrode 6 and a semiconductor layer 7.

The source electrode 3 is connected to the data line 1-1. The drain electrode 4 is connected to the pixel electrode 10. The semiconductor layer 7 is connected to both of the source electrode 3 and the drain electrode 4. In the semiconductor layer 7, a region provided between the source electrode 3 and the drain electrode 4 in an X-direction serves as a channel region. In FIG. 4, respective widths (channel width) of the source electrode 3 and the drain electrode 4 in a Y-direction are about 100 [μm], for example.

A part of the first gate electrodes 5 overlaps with at least a partial region of the semiconductor layer 7. That is, the first gate electrode 5 and the semiconductor layer 7 face to each other in the partial region. However, as will be described later, an insulating film intervenes between the first gate electrode 5 and the semiconductor layer 7 to electrically isolate them from each other. Moreover, the first gate electrode 5 is connected to the gate line 2-2.

The second gate electrode 6 also overlaps with a partial region of the semiconductor layer 7, as in the case of the first gate electrode 5. The second gate electrode 6 overlaps with the semiconductor layer 7 at a position closer to the drain electrode 4 than the first gate electrode 5 is. Moreover, the second gate electrode 6 is so provided as to overlap with a connection portion between the semiconductor layer 7 and the drain electrode 4. Furthermore, the second gate electrode 6 does not overlap the first gate electrode 5.

This second gate electrode 6 is electrically independent of the first gate electrode 5. The second gate electrode 6 is extended to the pixel electrode 10 and is connected to the pixel electrode 10. That is to say, the second gate electrode 6 and the drain electrode 4 are so connected through the pixel electrode 10 as to have the same electric potential.

Figure 5:
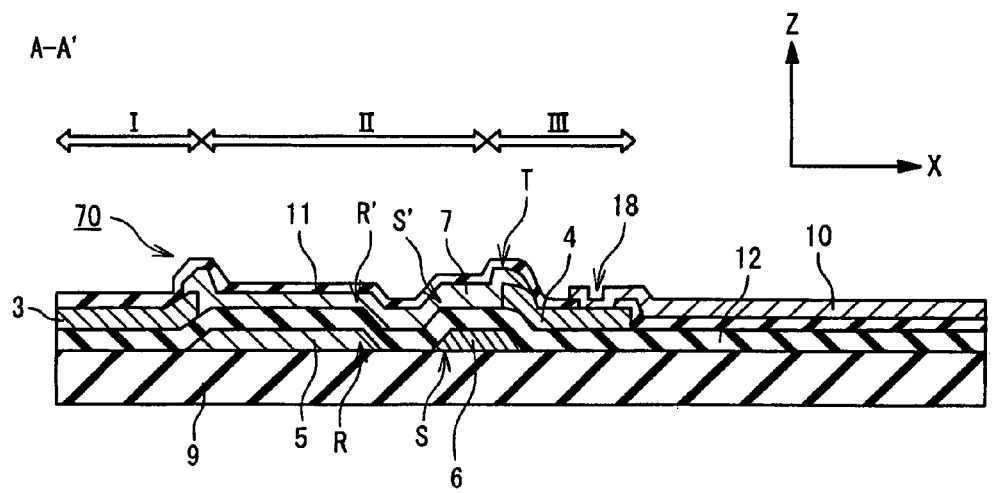
FIG. 5 is a schematic view showing a cross section along a line AA' in FIG. 4.
Figure 6:
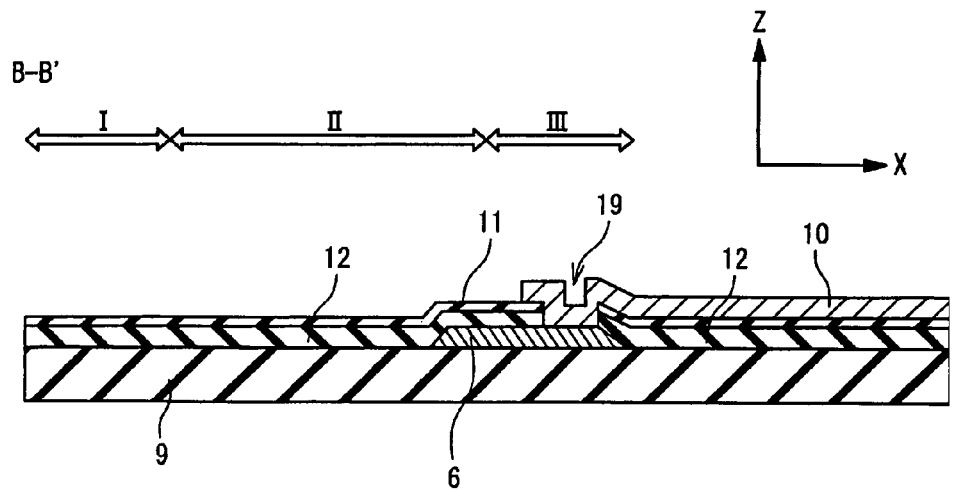
FIG. 6 is a schematic view showing a cross section along a line BB' in FIG. 4.

A layered structure of the switching element 70 will be explained with reference to FIGS. 5 and 6. FIG. 5 is a schematic cross-sectional view along a line A-A' in FIG. 4, and FIG. 6 is a schematic cross-sectional view along a line B-B'

As shown in FIG. 5, the first gate electrode 5 and the second gate electrode 6 are formed on a substrate 9. The first gate electrode 5 and the second gate electrode 6 are electrically isolated from a surface of the substrate 9.

The first gate electrode 5 and the second gate electrode 6 are so provided as to be electrically isolated from each other. A length of the first gate electrode 5 in a channel direction (in the X-direction in FIG. 5) is 40 [μm], for example. A thickness of the first gate electrode 5 is 0.2 [μm], for example. A length in the channel direction and a thickness of the second gate electrode 6 are, for example, 10 [μm] and 0.2 [μm], respectively. An interval between the first gate electrode 5 and the second gate electrode 6 is 20 [μm], for example. Material of the first and second gate electrodes is aluminum, for example.

An insulating film 12 is so provided as to cover the first gate electrode 5 and the second gate electrode 6. The insulating film 12 is a so-called gate insulating film, which is for electrically isolating each of the first gate electrode 5 and the second gate electrode 6 from the semiconductor layer 7. In the present embodiment, a silicon nitride film having a thickness of 0.4 [μm] is used as the insulating film 12. Although not illustrated, the insulating film 12 extends to the intersection region of the gate line 1 and the data line 2 to electrically isolate the gate line 1 and the data line 2 from each other.

The source electrode 3, the drain electrode 4 and the semiconductor layer 7 are provided on the insulating film 12. Each of the source electrode 3 and the drain electrode 4 is a metal electrode. In the present embodiment, a gold film having a thickness of 0.2 [μm] is stacked on a titanium film having a thickness of 0.01 [μm], which is used as the source electrode 3 and the drain electrode. A width of each of the source electrode 3 and the drain electrode 4 in the X-direction is 200 [μm], for example. An interval between the source electrode 3 and the drain electrode 4 is 55 [μm], for example.

The semiconductor layer 7 is provided between the source electrode 3 and the drain electrode 4 in the X-direction. The semiconductor layer 7 is so provided as to be in contact with both of the source electrode 3 and the drain electrode 4. In the present embodiment, both end portions of the semiconductor layer 7 are so provided as to cover respective end portions of the source electrode 3 and the drain electrode 4. Moreover, the connection portion between the semiconductor layer 7 and the drain electrode 4 overlaps with the second gate electrode 6 in a Z-direction shown in FIG. 5. That is, the second gate electrode 6 overlaps with both of the semiconductor layer 7 and the drain electrode 4 in the Z-direction.

The semiconductor layer 7 in the present embodiment is a layer including CNT. In the semiconductor layer 7, CNT forms a network. As the semiconductor layer 7, for example, a layer in which CNT having a length of 10 [μm] or less are provided at a density of 1 piece/[μm]$^2$ or less is used.

A surface of the switching element 70 is covered by an insulating protection film 11. That is, the protection film 11 is so provided as to cover the source electrode 3, the drain electrode 4 and the semiconductor layer 7. As the protection film 11, for example, a silicon nitride film having a thickness of 0.3 [μm] can be used.

The pixel electrode 10 is provided on a part of the protection film 11. A through hole 18 is provided in the protection film 11, and the pixel electrode 10 is connected to the drain electrode 4 through the through hole 18. Lengths of sides of the pixel electrode (L1 and L2 in FIG. 4) are 400 [μm], for example.

Moreover, as shown in FIG. 6, a through hole 19 that penetrates through the insulating film 12 and the protection film 11 is provided at a connection portion between the pixel electrode 10 and the second gate electrode 6. The pixel electrode 10 and the second gate electrode 6 are electrically connected to each other through this through hole.

In the display device thus configured, the control unit 50 controls operations of the gate line driving circuit 40 and the data line driving circuit 30 so as to switch a desired pixel. That is, with regard to a display element 20 whose optical transmittance is desired to be changed, an ON voltage signal is supplied to the gate line 2-2 by the gate line driving circuit 40. As a result, the switching element 70 becomes in the conductive state. Then, a voltage signal is supplied to the data line 1-1 by the data line driving circuit 30. A current flows to the pixel electrode 10 and the retention capacitor electrode 8 through the switching element 70, and the retention capacitor and the liquid crystal pixel are charged. Due to the charging of the liquid crystal pixel, the optical transmittance is changed. Subsequently, an OFF voltage signal that is a positive voltage is supplied to the gate line 2-2, and the switching element 70 is turned to the OFF state. At the time of OFF, the pixel is switched by electric charges stored in the retention capacitor and the liquid crystal pixel, and the switched state is maintained. For example, the switching element 70 operates as a p-channel type transistor with a gate voltage range of −40 to 40 [V], a source-drain operation voltage of 0 to 20 [V], an ON current of about 0.1 [mA] and an OFF current of about 1 [pA], and performs a function of switching the liquid crystal pixel.

At this time, since the second gate electrode 6 exists, an electric field at the connection portion between the drain electrode 4 and the semiconductor layer 7 can be controlled even when the gate voltage is positive (at the time of OFF). Consequently, the leakage current can be suppressed down to about 10 [pA], even when the gate voltage is positive and large.

Figure 2:
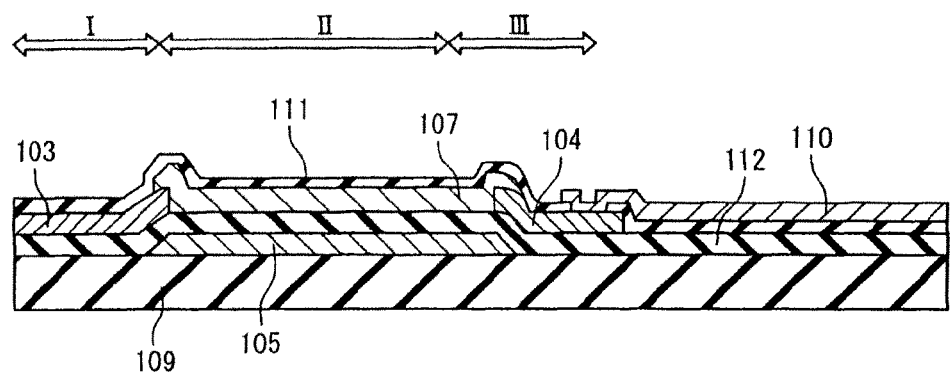
FIG. 2 is a schematic cross-sectional view of a typical CNT-FET.
Figure 7:
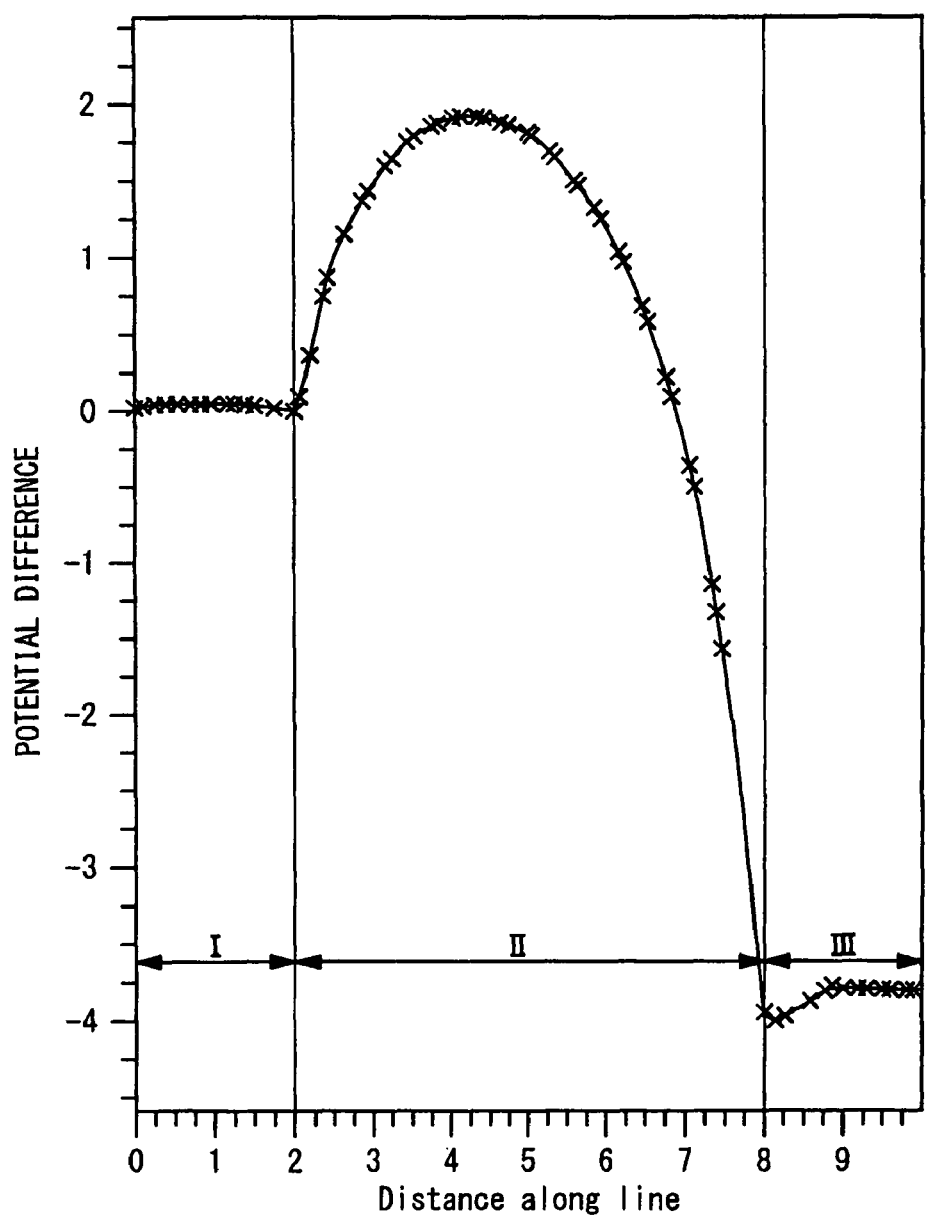
FIG. 7 is a diagram showing a potential distribution in a comparative example.
Figure 8:
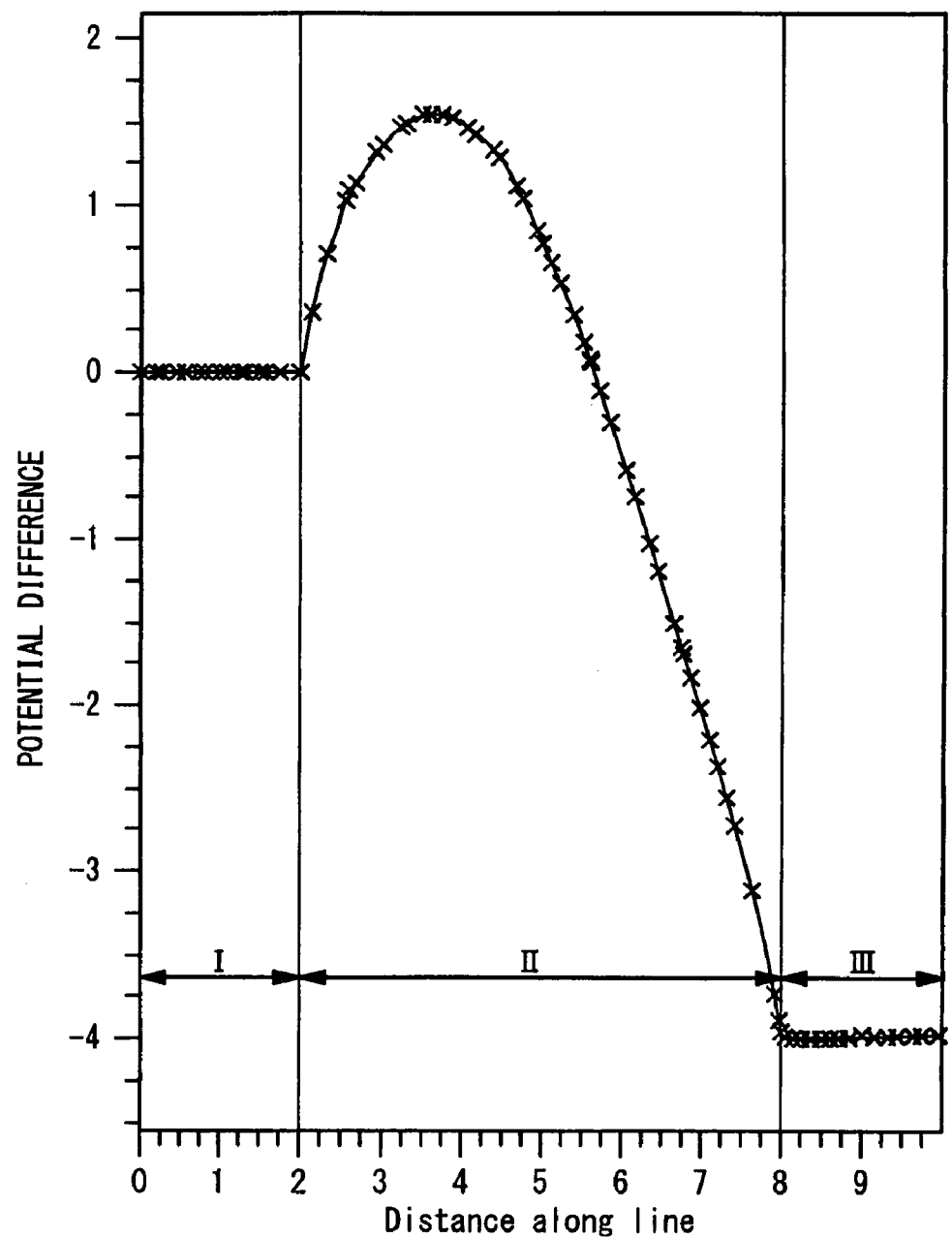
FIG. 8 is a diagram showing a potential distribution in the first embodiment.

An action of the second gate electrode 6 will be explained referring to FIGS. 7 and 8. FIG. 7 is a diagram showing a potential distribution in a transistor in a case where the second gate electrode 6 is not provided (hereinafter referred to a comparative example). Here, the CNT-FET shown in FIG. 2 is explained as the comparative example. On the other hand, FIG. 8 is a diagram showing a potential distribution in the switching element 70 according to the present embodiment. In both diagrams, regions I, II and III indicate positions corresponding to the source electrode, the semiconductor layer region (channel region) and the drain electrode, respectively. Specifically, it shows the potential distribution in a case where the width of the channel region II in the X-direction is 6 [μm], −4 [V] is applied between the source region I and the drain region III, and 5 [V] is applied as the gate voltage.

In FIG. 7 (comparative example), a gate length (a length of the gate electrode 105 in the X-direction) is 6 [μm]. Moreover, both end portions of the gate electrode 105 in the channel direction (in the X-direction) face respective end portions of the drain electrode 104 and the source electrode 103.

In FIG. 8 (example of the present embodiment), on the other hand, a width of the first gate electrode 5 in the X-direction is 3 [μm] and a width of the second gate electrode 6 in the X-direction is 0.7 [μm]. An end portion of the first gate electrode 5 on the source electrode is located at a position facing an end portion of the source electrode 3. The second gate electrode 6 and the drain electrode 4 overlap with each other by 0.2 μm in the X-direction. The second gate electrode 6 has the same electric potential as the drain electrode 4, and −4 [V] is applied thereto.

In general, the CNT-FET without doping operates as a p-type channel transistor. In this case, when a positive voltage is applied to the gate electrode 105 of the CNT-FET (at the time of OFF), a potential is generated in the channel region (II) of the comparative example, as shown in FIG. 7. This potential is a barrier for holes as carriers. Also in the present invention, the switching element 70 operates as a p-type channel transistor. When a positive voltage is applied to the first gate electrode 5, a potential which is a barrier for holes as majority carriers is generated in the channel region (II) as shown in FIG. 8.

Here, in the case where the gate voltage is positive, it is expected that the holes as the majority carriers are blocked by the barrier generated in the gate region and does not move from the source region (I) toward the drain region (III). However, the off-leakage current at the time of the OFF operation is caused not only by the holes as majority carriers but also by electrons as minority carriers. Here, the electrons are considered to be supplied from the drain side. In the case of the comparative example shown in FIG. 7, potential gradient of the channel region (II) is steep in the vicinity of the interface between the channel region (II) and the drain region (III). This means that a large voltage is applied to the Schottky barrier.

Figure 9:
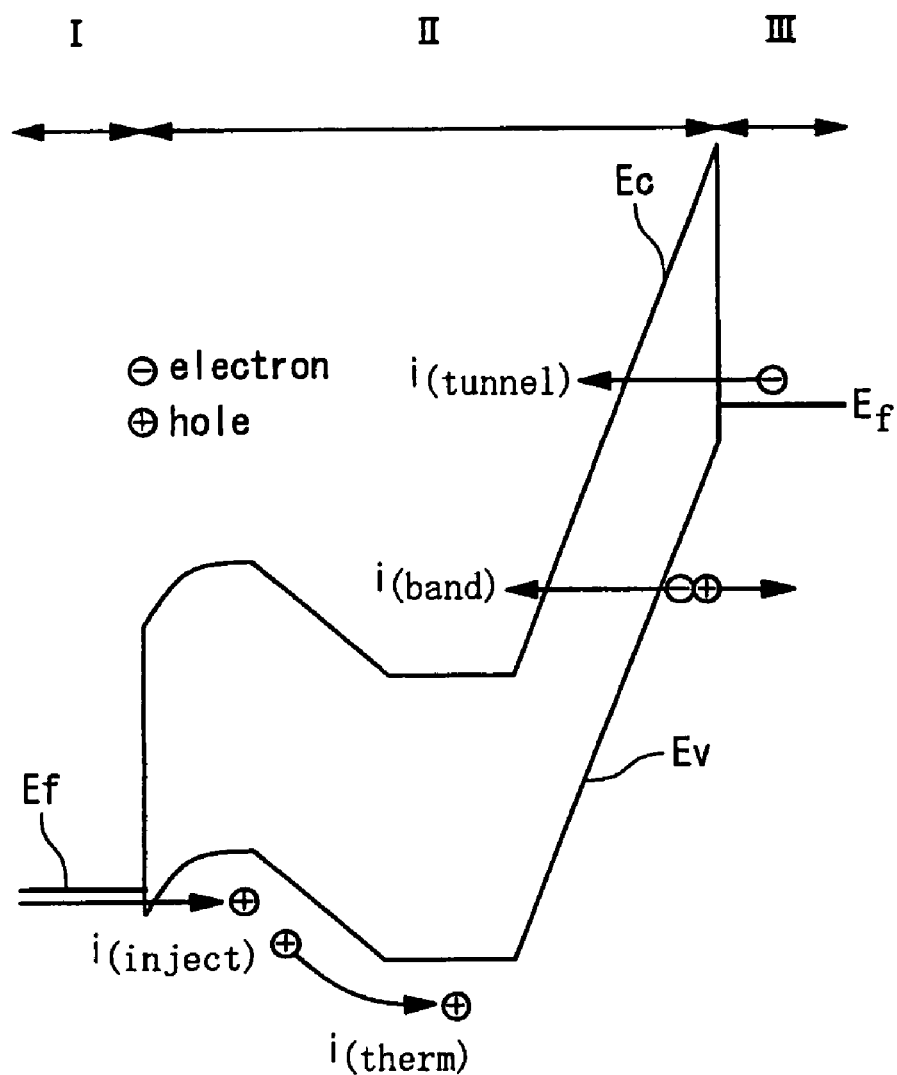
FIG. 9 is an energy band diagram for showing a mechanism of a leakage current in the comparative example.
Figure 10:
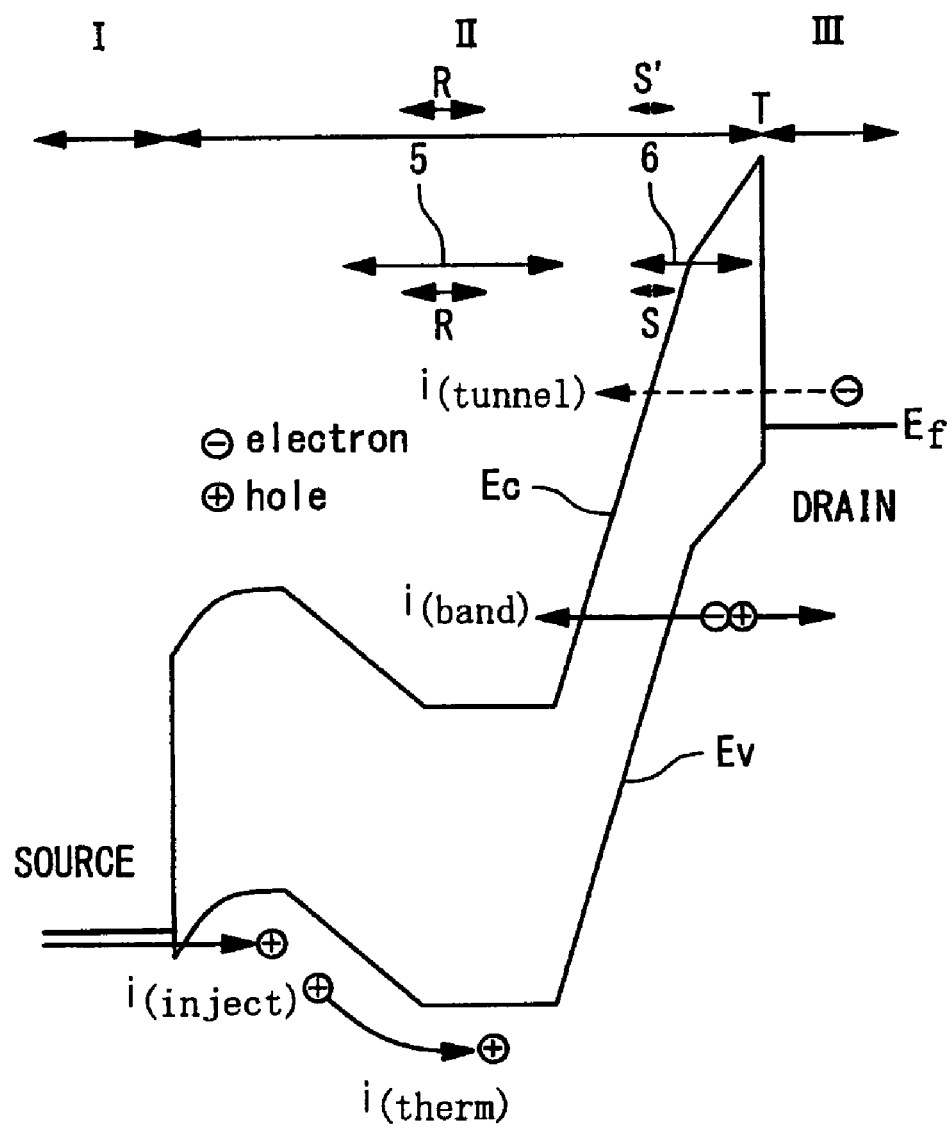
FIG. 10 is an energy band diagram for showing a mechanism of a leakage current in the first embodiment.
Figure 12A:
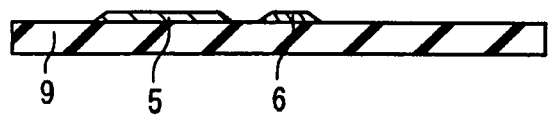
FIG. 12A is a process sectional view showing a manufacturing method in the first embodiment.
Figure 12B:
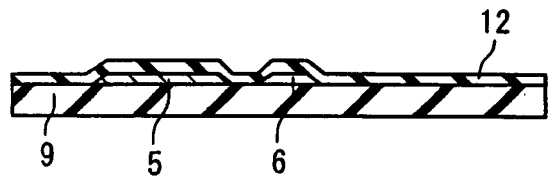
FIG. 12B is a process sectional view showing the manufacturing method in the first embodiment.
Figure 12C:
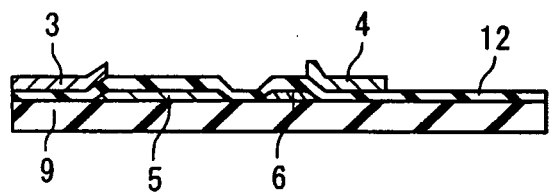
FIG. 12C is a process sectional view showing the manufacturing method in the first embodiment.
Figure 12D:
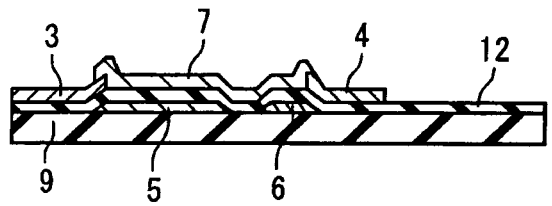
FIG. 12D is a process sectional view showing the manufacturing method in the first embodiment.
Figure 12E:
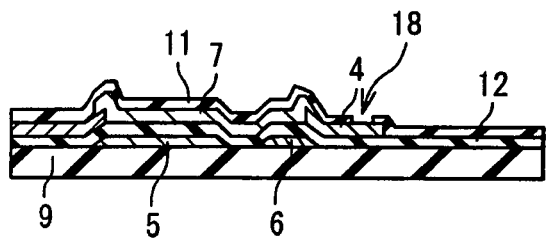
FIG. 12E is a process sectional view showing the manufacturing method in the first embodiment.
Figure 12F:
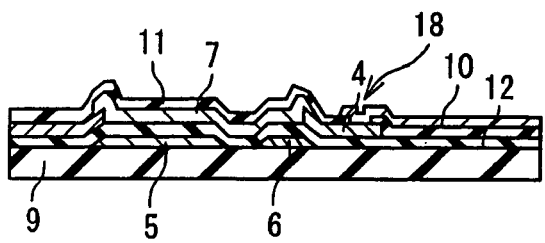
FIG. 12F is a process sectional view showing the manufacturing method in the first embodiment.

The Schottky barriers in the comparative example and the present invention will be explained referring to FIGS. 9 and 10. FIG. 9 is a diagram showing an energy band in the comparative example (the CNT-FET shown in FIG. 2). FIG. 10 is a diagram showing an energy band in the region of the switching element 70 in the present invention.

Referring to FIGS. 9 and 10, a height of the Schottky barrier (a potential energy from the Fermi level (Ef) to the bottom level (Ec) of the conduction band at an interface between metal and semiconductor) is determined by the metal and a material being in contact with it, and does not vary depending on an external voltage. However, a thickness of the Schottky barrier (a total sum of distances between positions at which the bottom level (Ec) of the conduction band is more than or equal to the Fermi level (Ef) and the interface between the metal and the semiconductor) depends on a potential difference between both sides of the Schottky barrier, namely, an electric field in the Schottky barrier. Therefore, when field strength at the interface between the drain region (III) and the channel region (II) is large, the thickness of the Schottky barrier becomes thin. In general, probability that an electron tunnels through the Schottky barrier depends on the thickness of this Schottky barrier as well as the height of the Schottky barrier, and becomes higher as the thickness becomes smaller.

The energy band in the comparative example will be explained referring to FIG. 9. A large number of holes are injected from the source region (I) to the channel region (II) (I (inject)). A part of the injected holes climb over the energy barrier of the channel region (II) due to thermal energy and the like (I (therm)). On the other hand, the Schottky barrier is formed at the interface portion between the channel region (II) and the drain region (III). At the time of OFF, the gate voltage is positive and the potential at a central portion of the channel region (II) is reduced. This becomes a potential barrier for holes. For this reason, the current (I (therm)) by the holes passing through the central portion of the channel region (II) is suppressed. However, on the other hand, the gradient of the band gap is steep at the channel region (II) near the drain region (III). For this reason, the thickness of the energy barrier (Schottky barrier) from the Fermi level (Ef) of the drain region (III) being the metal electrode to the conduction band Ec of the channel region (II) becomes thin. Therefore, there exist electrons that tunnel through this energy barrier from the drain region (I) side (I (tunnel)). The electrons tunneling to the conduction band (Ec) of the channel region (II) flow to the region (I), which is the leakage current.

In contrast to the comparative example, according to the present embodiment, the potential gradient in the vicinity of the interface between the channel region (II) and the drain region (III) is relaxed as shown in FIG. 8. The reason is that the electric field applied to the vicinity of the channel region-drain region interface is controlled by the second gate electrode 6 that has the same electric potential as that of the drain electrode 4. In this manner, the leakage current is suppressed because the potential gradient is relaxed.

This point is explained referring to FIG. 10. In the vicinity of the interface between the channel region (II) and the drain region (III), the gradient of the energy band on the channel region (II) side is relaxed. Thereby, the barrier for the electrons of the drain electrode (II) to tunnel through to the conduction band Ec of the channel region becomes thicker. In other words, although the height of the Schottky barrier in the present invention is not changed from that of the comparative example, the thickness of the Schottky barrier becomes larger than that in the comparative example. Therefore, in the switching element 70 according to the present invention, the occurrence of the tunnel current (I (tunnel)) going over the Schottky barrier is suppressed and thus the off-leakage current is suppressed.

From the above, it can be said that the thickness of the Schottky barrier in the vicinity of the interface between the channel region (II) and the drain region (III) is controlled by the second gate electrode 6 according to the present embodiment.

Moreover, in the present embodiment, the first gate electrode 5 and the second gate electrode 6 do not overlap with each other when seen from the Z-direction. This is also advantageous in that the gradient of the potential change on the drain electrode 4 side of the channel region (II) can be relaxed. If the first gate electrode 5 and the second gate electrode 6 overlap with each other, it may cause a rapid change in the potential in the channel region (II).

Moreover, in the present embodiment, it is possible to turn off the switching element, namely achieve a situation where no current flows, under a condition that the gate voltage (voltage applied to the first gate electrode) is not applied (i.e. the gate voltage is zero). Therefore, power consumption in an integrated circuit can be reduced.

Moreover, in the present embodiment, the voltage of the second gate electrode 6 is connected to the drain electrode 4 through the pixel electrode 10. Therefore, the voltage of the second gate electrode 6 automatically becomes the same potential as that of the drain electrode 4, and thus there is no need to provide an interconnection for controlling the voltage of the second gate electrode 6. Consequently, it is not necessary to decrease an effective area of the display pixels. The leakage current can be suppressed while maintaining the effective pixel area.

An arrangement structure of the first gate electrode 5 and the second gate electrode 6 will be explained with reference to FIG. 11. FIG. 11 is a diagram schematically showing only an interconnection part in the cross-sectional view shown in FIG. 5. It is important that the second gate electrode 6 is provided near a portion where the Schottky barrier between the semiconductor layer 7 and the drain electrode 4 is formed. As shown in FIG. 11, the second gate electrode 6 is preferably provided so as to overlap in the Z-direction the connection portion T between the drain electrode 4 and the semiconductor layer 7.

Moreover, it is desirable from a view point of relaxing the potential gradient that the first gate electrode 5 is provided away from the drain electrode 4. More specifically, it is desirable that an end portion R of the first gate electrode 5 on the side of the drain electrode 4 is so provided as to face the central portion R' of the channel region (II). Due to this configuration, the gradient of the potential change in the channel region (II) on the side of the drain electrode 4 can be relaxed down to about the half as compared with a case where a gate electrode is provided over whole of the channel region. As a result, the thickness of the energy barrier at the interface between the channel region (II) and the drain electrode 4 can be maintained as large as about twice. Since the amount of the tunnel current (I (tunnel)) depends on the thickness of the energy barrier almost exponentially, the leakage current can be suppressed exponentially even when the difference in the thickness of the barrier corresponds to about twice.

Moreover, a thickness of a skirt of the Schottky barrier in the channel region (II) (the Schottky barrier such that the bottom of the conduction band (EC) is near the Fermi level (Ef)) is, for example, about 10 [μm] from the interface portion (connection portion T) with the drain electrode 4. In this case, it is preferable that an end portion S of the second gate electrode 6 on the first gate electrode side is so provided as to face a region S' located away from the connection portion T between the drain electrode 4 and the semiconductor layer 7 toward the source electrode 3 by 10 [μm] or more. In other words, it is preferable that the second gate electrode 6 overlaps with the channel region (II) for a width of at least 10 [μm] or more.

Next, a method of manufacturing the display device of the present embodiment will be described. FIGS. 12A to 12F are process sectional views showing an example of the manufacturing method of the display device of the present embodiment.

FIG. 12A

As the substrate 9, a Poly Ethylene Naphthalate (PEN) substrate of thickness 200 [μm] is prepared, for example. Then, the first gate electrode 5 and the second gate electrode 6 are formed on the substrate 9. Specifically, aluminum for gate electrodes is formed on the whole surface of the substrate 9 by sputtering. Then, using a common lithography technique, pattern formation and wet etching is performed. Etching of aluminum can be performed using a common etchant. As the etchant, an aqueous solution of at least one kind of phosphoric acid, nitric acid, and acetic acid can be enumerated, for example. Moreover, alkali developing solution of the positive resist for optical lithography and the like can be used as the etchant.

Note that a technique that will be described below can also be used as another technique of forming the first gate electrode 5 and the second gate electrode 6. First, resist is formed on the substrate 9, which is patterned so that its regions in which the first gate electrode 5 and the second gate electrode 6 are scheduled to be formed may be opened. Then, aluminum is deposited to form a film. In this case, for film formation of aluminum, a film forming method that gives strong anisotropy, such as evaporation, is preferable. Then, the resist is removed by a solvent. Thereby, only aluminum of an aperture part remains on the substrate 9 and the first gate electrode 5 and the second gate electrode 6 are formed. Generally, such a technique is known as a liftoff method.

FIG. 12B

Next, the insulating film 12 is formed. Specifically, a silicon nitride film is formed by sputtering. Silicon nitride is used as a target at the time of sputtering. Moreover, argon gas is used as a gas of plasma. Moreover, in order to improve a quality of the film, nitrogen of 20 sccm is also introduced simultaneously. Pressure at the time of sputtering is 2 Pa. The insulating film 12 is sputtered so that its film thickness may become 0.4 [μm], for example.

Incidentally, in forming the insulating film 12, a vapor deposition method, a heat vapor phase growth method, a method whereby an organic insulating layer is heated and activated to deposit, etc. may be used other than sputtering.

FIG. 12C

Next, the source electrode 3 and the drain electrode 4 are formed. Specifically, photoresist that is opened in a formation-scheduled region of the source electrode 3 and the drain electrode 4 is formed, and titanium and gold are evaporated thereon. Then, gold that was evaporated on an unnecessary portion is removed by removing a photoresist, i.e., by lift-off. Thereby, only gold that is evaporated on a photoresist aperture part remains and the source electrode 3 and the drain electrode 4 are formed.

As another technique of forming the source electrode 3 and the drain electrode 4, a technique that is used commonly in a manufacture method of a usual semiconductor device can also be used. For example, metal (gold-titanium) is first deposited to form a film on the whole surface of the insulating film 12. After that, using lithography, resist that is opened in the unnecessary portion is formed. Then, by etching the metal of the unnecessary portion using this resist as a mask, only the metal of the desired portion is made to remain. Furthermore, as a further different method, a method of printing an electrically conductive ink may be used.

FIG. 12D

Then, the semiconductor layer 7 is formed. The semiconductor layer 7 can be formed by spin-coating a dichloroethane solution of CNT and removing an unnecessary portion. Specifically, first, a solution in which CNT is dissolved in dichloroethane is adjusted. In adjusting the solution, it is adjusted so that the density of CNT may become about $1 \times 10^{-6}$ by a weight ratio. Further specifically, first, CNT of 1 [mg] is dissolved in dichloroethane of 100 [ml]. This is dispersed ultrasonically for about one hour or so. Next, 3 [ml] is picked up from this CNT solution, and is diluted with dichloroethane of 27 [ml]. This prepares a CNT solution of a concentration of about $1\times10^{-6}$ by a weight ratio. Furthermore, this solution is dispersed by a commercial ultrasonic homogenizer for one hour. In the process of spin coating, the adjusted CNT solution of about 40 [pl] is dropped on the substrate and the substrate is rotated at about 800 [rmp] for about 10 seconds. Although depending on a surface state of the substrate, the density of CNT differs, the density becomes about 0.6 [line/$\mu m^2$] by a spin coating process of four to five times. The density of CNT can be adjusted by the number of times of a spin coating process. In removing CNT of an unnecessary portion, a silicon nitride film patterned as a mask is formed and CNT is removed by oxygen ashing. The silicon nitride film for the mask is formed by sputtering, and is patterned by optical lithography.

Moreover, in removing CNT of the unnecessary portion, it is also possible to use the liftoff method. That is, resist that is opened only in a formation-scheduled region of the semiconductor layer 7 is formed by lithography. After that, CNT is spin-coated. Then, CNT of the unnecessary portion together with the resist is removed by a resist solvent.

Alternatively, as another technique of forming CNT, the other method than the spin coating can also be used. For example, any one among a method of pulling up the substrate after immersing it in a CNT solution and drying it, a method of dropping and drying a CNT solution only in a region where the semiconductor layer 7 is scheduled to be formed with a dispenser (an injection syringe), a method of using an ink-jet printing machine, etc. may be used. Incidentally, when adopting the method of pulling up the substrate after immersing it, since CNT adheres to the whole surface of the substrate, a process of selectively removing CNT of the unnecessary portion, like the spin coating method, is required.

FIG. 12E

Next, the protection film 11 is formed. The protection film 11 can be formed by depositing a silicon nitride film by sputtering like the insulating film 12. Moreover, other than the sputtering, an evaporation method, a heat vapor phase growth method, a method of heating and activating an organic insulating layer and depositing it, etc. may be used.

FIG. 12F

Next, the pixel electrode 10 is formed. Before forming the pixel electrode 10, the through hole 18 for connection is formed in the protection film 11 on the drain electrode 4. The through hole 18 can be formed by forming a resist mask by lithography and dry-etching a region where the through hole is scheduled to be formed in the protection film 11. After that, the resist mask is peeled off and a metal for the pixel electrode 10 is formed. Specifically, first, ITO (Indium Tin Oxide) is formed over the whole surface by sputtering. In this process, the through hole is also buried with ITO. After that, a pattern that exposes the unnecessary portion is formed by lithography and ITO of the unnecessary portion is removed by wet etching.

The display element 20 is manufactured by the above-explained processes shown in FIGS. 12A to 12F. According to the manufacture method described above, a process of doping impurities into the semiconductor layer 7 is not necessary. Therefore, a manufacturing process can be shortened and a manufacturing cost can be reduced.

In the present embodiment, as shown in FIG. 5, the end portion of the drain electrode 4 is covered by the semiconductor layer 7 in the contact portion between the semiconductor layer 7 and the drain electrode 4. The same applies to the contact portion between the semiconductor layer 7 and the source electrode 3. However, a stacking order of the source electrode 3, the drain electrode 4, the semiconductor layer 7, the first gate electrode 5 and the second gate electrode is not limited to the above-described example but can be determined as appropriate. For example, the overlapping order in the connection portions of the semiconductor layer 7 and the both electrodes shown in FIG. 12 may be changed and the stacking order may be changed as shown in FIGS. 13 to 15.

Figure 13:
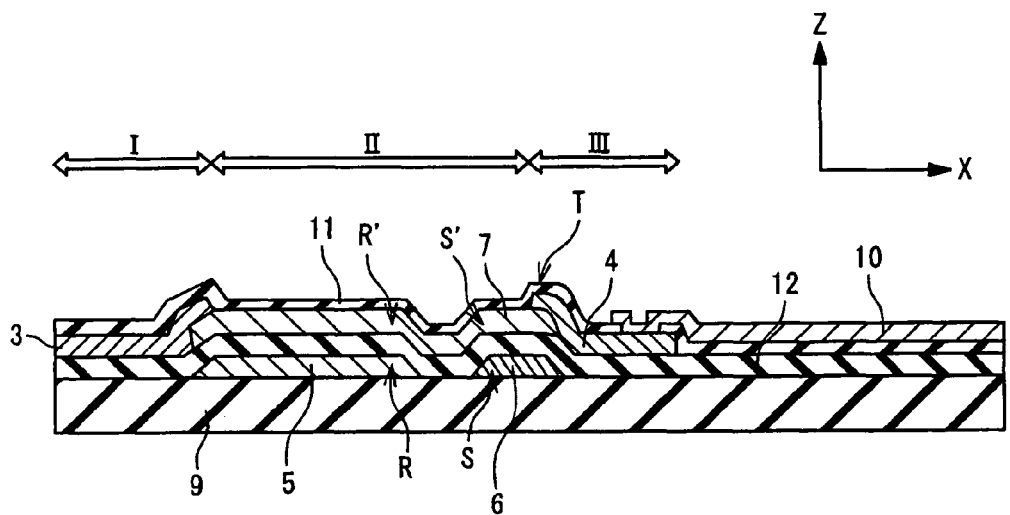
FIG. 13 is a schematic cross-sectional view showing a layered structure in a modification example of the first embodiment.

As shown in FIG. 13, the end portion of the semiconductor layer 7 can be covered by each electrode (the source electrode 3 and the drain electrode 4) in the contact portion between the semiconductor layer 7 and the each electrode. As shown in FIG. 14, the source electrode 3, the drain electrode 4 and the semiconductor layer 7 may be provided closer to the substrate 9 than the first gate electrode 5 and the second gate electrode 6 are. In this case, an insulating film 13 may be provided on the surface of the substrate 9 in order to give the insulation to the surface of the substrate 9. In the case of the example shown in FIG. 14, the cross-sectional structure along the line BB' in FIG. 4 is as shown in FIG. 15. Alternatively, as shown in FIG. 16, the drain electrode 4 and the second gate electrode 6 may be directly connected to each other instead of being electrically connected through the pixel electrode 10.

Figure 14:
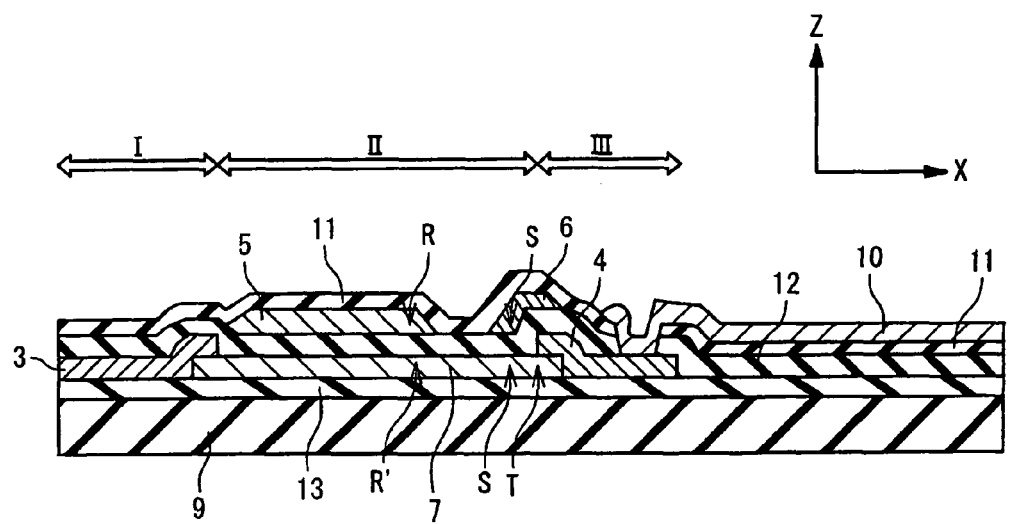
FIG. 14 is a schematic cross-sectional view showing a layered structure of a modification example of the first embodiment.
Figure 15:
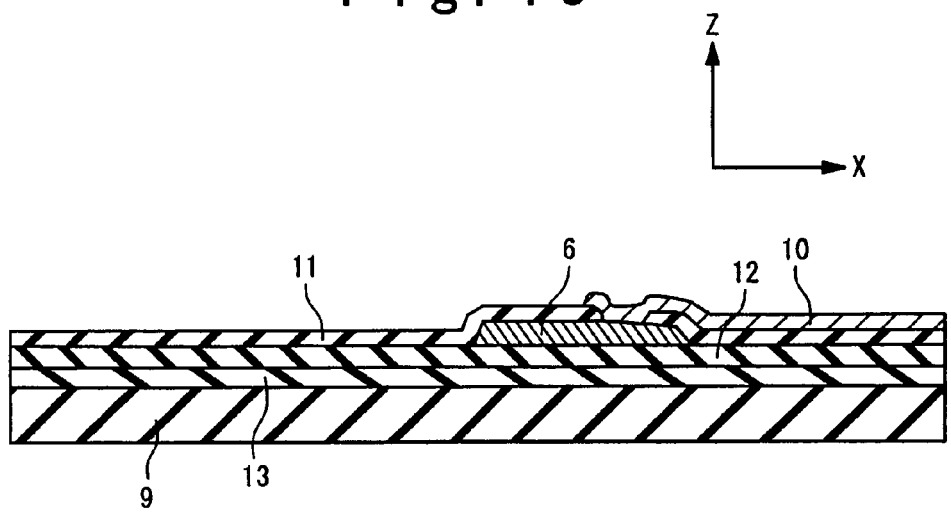
FIG. 15 is a schematic cross-sectional view showing a layered structure of a modification example of the first embodiment.
Figure 16:
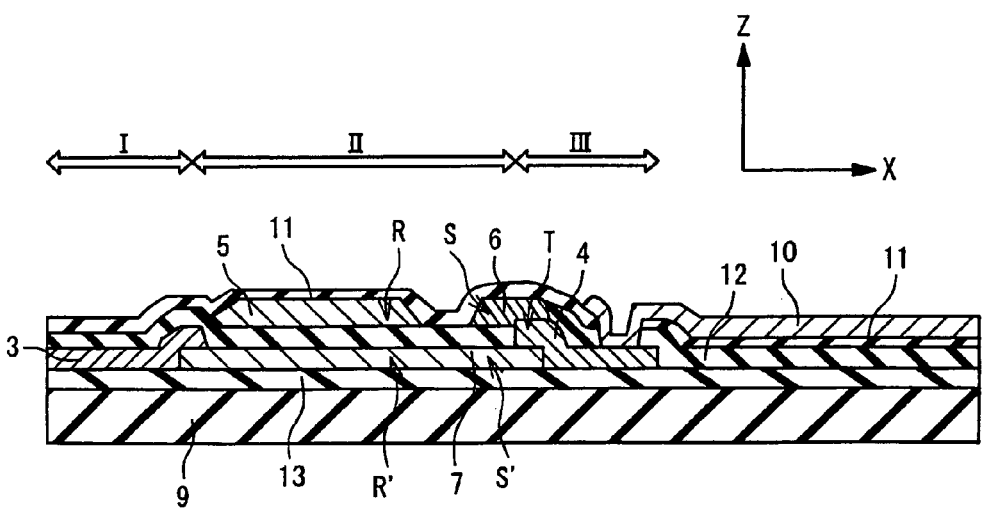
FIG. 16 is a schematic cross-sectional view showing a layered structure of a modification example of the first embodiment.

Even when the stacking order is changed, it is preferable that the end portion R of the first gate electrode 5 on the side of the drain electrode 4 is so provided as to face the central portion R' of the channel region (II), as shown in FIGS. 13 to 15. Moreover, it is preferable that the second gate electrode 6 is so provided as to overlap in the Z-direction with the connection portion T between the drain electrode 4 and the semiconductor layer 7. Furthermore, it is preferable that the end portion S of the second gate electrode 6 on the side of the first gate electrode is so provided as to face the region S' located at the skirt of the Schottky barrier in the Channel region (II). In this case, the second gate electrode 6 and the semiconductor layer 7 overlap in the Z-direction within a range including the connection portion T and extending to the region S'.

As a material of the substrate 9, any material do as long as its surface has insulation and is not restricted to the PEN substrate exemplified in the present embodiment. As the substrate 9, for example, even plastic plates, such as of polyimide (polyimide), polyethylene terephthalate (PET), polyether sulphone (PES), can be used. Moreover, it may be other than the plastic substrate, and a metallic foil with the insulating layer 13 stuck on its surface may used as the substrate 9, as shown in FIG. 14. In this case, for example, an aluminum thin film or a stainless steel thin film with polyimide etc. layered thereon or the like can be used as the substrate 9.

Moreover, as a material of the first gate electrode 5 and the second gate electrode 6, tantalum, chromium, etc. with comparatively low resistances can be used preferably.

Moreover, as materials of the source electrode 3 and the drain electrode 4, they are not restricted to the material exemplified in the present embodiment. When the semiconductor layer 7 is a p-type semiconductor layer including CNT, it is preferable that a material into which the positive hole is easy to be injected is used for the source electrode 3 and the drain electrode 4. Specifically, it is preferable to use one that has a large work function, such as gold and palladium, as the source electrode 3 and the drain electrode 4. On the other hand, in the case where the semiconductor layer 7 is an n-type semiconductor layer, it is preferable that a material such that an electron is easy to be injected thereinto is used for the source electrode 3 and the drain electrode 4. Specifically, it is preferable to use ones that each has a small work function, such as aluminum, calcium, potassium, magnesium, cesium, and sodium, as the source electrode 3 and the drain electrode 4. Generally, since many metals of a small work function are unstable in the atmosphere, it is recommended that they be covered with different metals that are stable in the atmosphere.

The insulating layers 12, 13 and 14 and the protection film 11 just need to have insulation property, and they are not limited to a silicon nitride film mentioned above. As the insulating layers 12, 13 and 14 and the protection film 11, a silicon oxide film, a parylene film, a polyimide film and so on can also be used for example.

It is required for the insulating layer 12 provided between the first and second gate electrodes 5, 6 and the semiconductor layer 7 that there is no leakage current and the field effect is effective. As a material capable of suppressing the leakage current, it is possible to enumerate a silicon oxide film, a silicon nitride film, a polyparaxylylene film, a polyimide film, a HSQ (hydrogen silsesquioxane) film, a SOG (spin coating on glass) film and so on. Moreover, it is important from a view point of making the field effect effective that the thickness of the insulating film 12 is made smaller than the channel length (a distance between the source electrode 3 and the drain electrode 4 in the X-direction). By thinning the insulating film 12, a phenomenon generally called the short channel effect can be prevented. For this reason, it is preferable that the thickness of the insulating film 12 is smaller than 1/10 of the channel length. For example, when the channel length is 10 [μm], it is preferable that the thickness of the insulating film 12 is 1 [μm] or less.

In the present embodiment, the CNT-FET using a layer including CNT as the semiconductor layer 7 is explained as an example. It is also possible to apply the present invention to a transistor other than the CNT-FET, as long as it is the one where the leakage current caused by the Schottky barrier portion between the semiconductor layer 7 and the drain electrode 4 is considered as a problem.

Therefore, any material whose conduction electron density or hole density is modulated by an electric field can be used as the semiconductor layer 7. For example, polythiophene, pendant-type polymeric materials that have low molecule type frames in their side chains, pentacene, fullerene, such as C60 and C70, phthalocyanine derivatives, triphenylamine derivatives, such as α-NPD (N,N'-diphenyl-N,N'-bis(1-naphthyl)-1,1' biphenyl-4,4" diamine) and the like can be used as the semiconductor layer 7.

Moreover, if the manufacture method is not restricted to printing and application, it is also possible to use bulk semiconductors, such as usual silicon and gallium arsenide, as the semiconductor layer 7. That is, in the case where a semiconductor material whose band gap is small (e.g. 1 eV or less) is used, application of the structure of the present invention will be effective in reduction of the leakage current.

In the present embodiment, the liquid crystal display that uses the liquid crystal pixel as a pixel is described as an example. However, the present invention is not limited to the liquid crystal display. Even if the present invention is applied to an electronic paper using electrophoresis, such as a microcapsule electrophoresis type and an In-Plane electrophoresis type, an electric paper of a twist ball system (Gyricon beads system), and a toner display using a counter electrode, for example, the action described in the present embodiment can be enjoyed.

Second Embodiment

A second embodiment of the present invention will be described. In the present embodiment, an emission pixel of organic EL (electroluminescence) is used as the pixel. Moreover, a current supply line 17 and a current driving element 90 are added to the first embodiment. A configuration of the display element of the present embodiment will be described below in detail. An overlapping description with the first embodiment will be omitted as appropriate.

Figure 17:
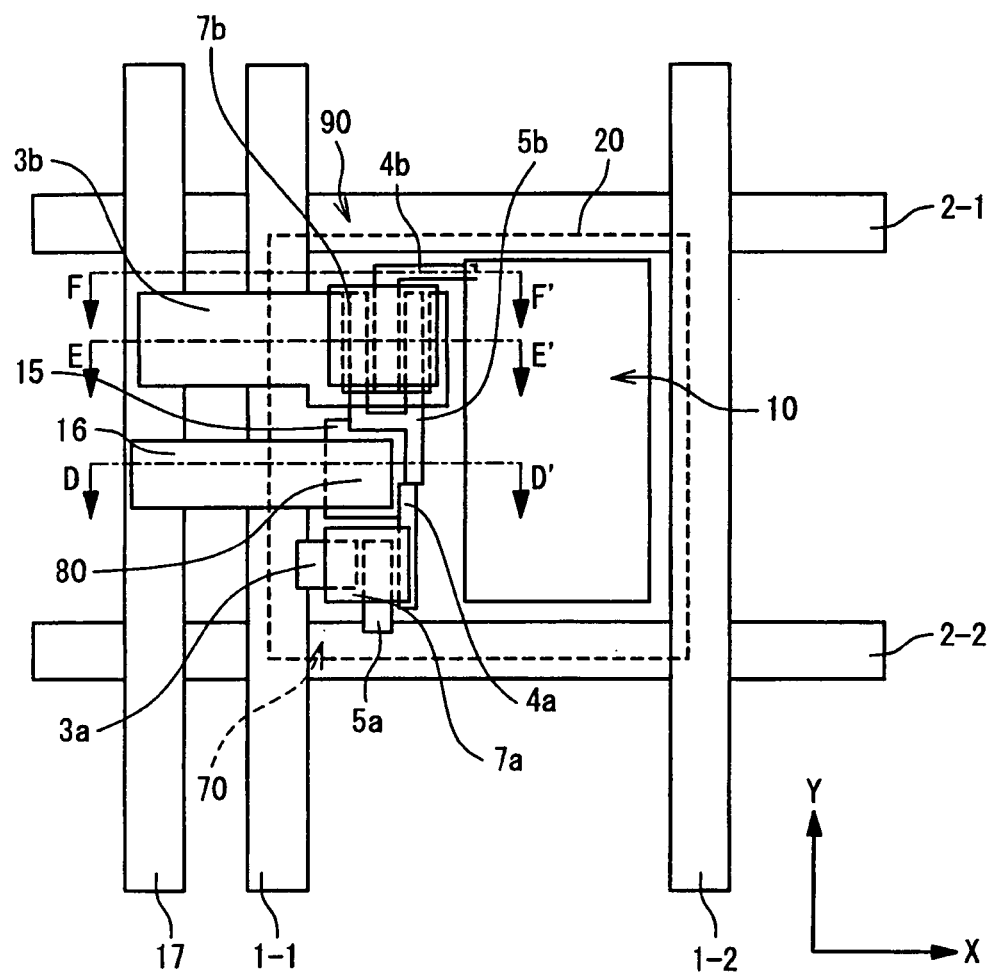
FIG. 17 is a plan view showing configuration of a display element according to a second embodiment.
Figure 18:
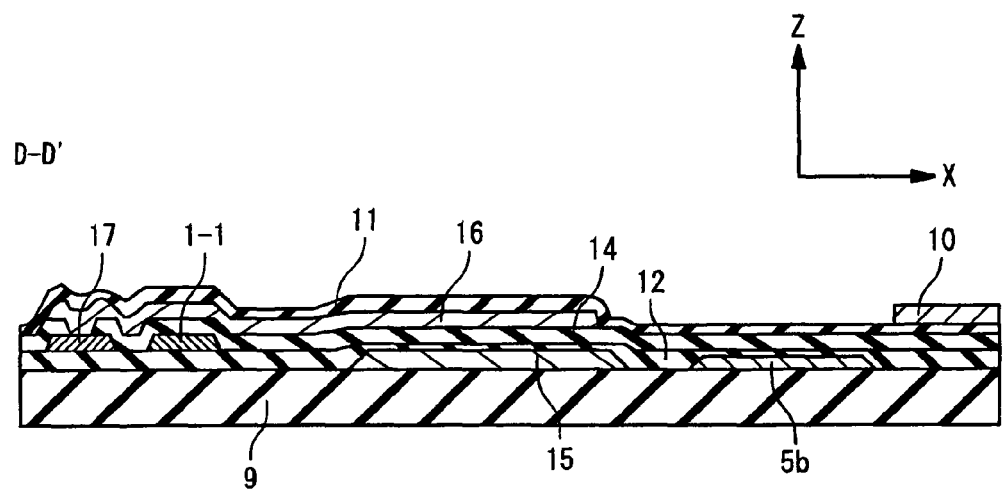
FIG. 18 is a schematic view showing a cross section along a line DD' in FIG. 17.
Figure 19:
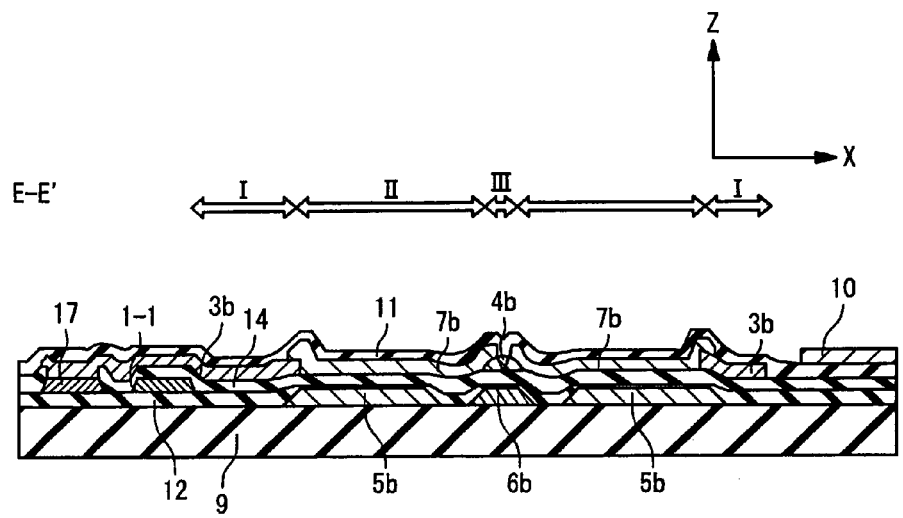
FIG. 19 is a schematic view showing a cross section along a line EE' in FIG. 17.
Figure 20:
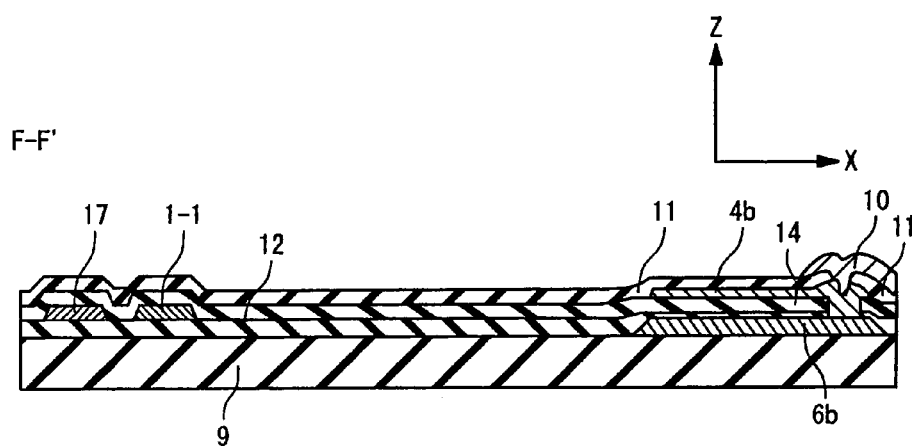
FIG. 20 is a schematic view showing a cross section along a line FF' in FIG. 17.
Figure 21A:
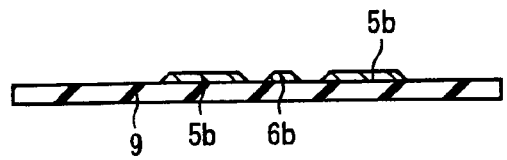
FIG. 21A is a process sectional view for explaining a manufacturing method in the second embodiment.
Figure 21B:
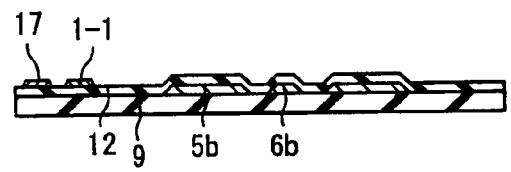
FIG. 21B is a process sectional view for explaining the manufacturing method in the second embodiment.
Figure 21C:
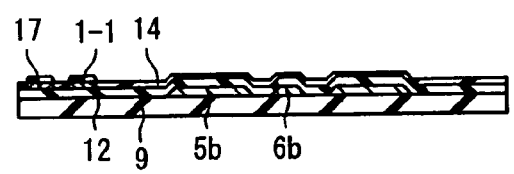
FIG. 21C is a process sectional view for explaining the manufacturing method in the second embodiment.
Figure 21D:
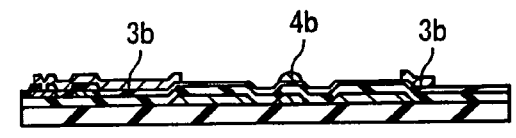
FIG. 21D is a process sectional view for explaining the manufacturing method in the second embodiment.
Figure 21E:
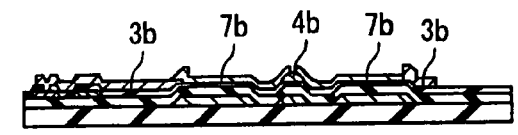
FIG. 21E is a process sectional view for explaining the manufacturing method in the second embodiment.
Figure 21F:
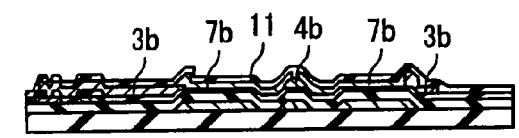
FIG. 21F is a process sectional view for explaining the manufacturing method in the second embodiment.
Figure 21G:
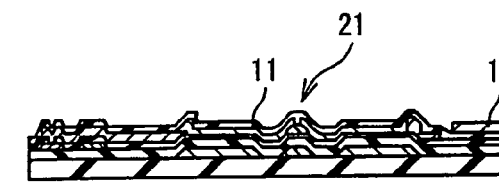
FIG. 21G is a process sectional view for explaining the manufacturing method in the second embodiment.

FIG. 17 is a plan view schematically showing a configuration of the display element 20 of the present embodiment. Note that, although the configuration illustrated in FIG. 17 cannot be actually seen through because it is covered with a protection film and the like, it is shown as is seen though for convenience of explanation. FIGS. 18, 19 and 20 show cross sections along lines DD', EE' and FF' in FIG. 17, respectively. Referring to FIG. 17, the display element 20 in the present embodiment has the switching element 70, a retention capacitor portion 80 and the current driving element 90. The retention capacitor portion 80 is provided between the switching element 70 and the current driving element 90. The current driving element 90 is formed of a field-effect type transistor.

As shown in FIG. 17, the current supply line 17 is so provided as to be substantially parallel to the data line 1-1. The current supply line 17 is connected to a current supply line driving circuit (not shown) that drives the current supply line 17.

A source electrode 3b of the current driving element 90 is connected to the current supply line 17. A drain electrode 4b of the current driving element 90 is connected to the pixel electrode 10. That is, the current driving element 90 controls current supply from the current supply line 17 to the pixel electrode 10.

A drain electrode 4a of the switching element 70 is not connected to the pixel electrode 10 but to a gate electrode 5b of the current driving element 90. That is, the switching element 70 ON/OFF controls the current driving element 90. Also, the second gate electrode 6 (omitted in FIG. 17) is not connected to the pixel electrode 10 but is directly connected to the drain electrode 4a through a through hole. The other configuration of the switching element 70 is similar to that described in the first embodiment. Regarding the configuration of the switching element 70, the stacking order may be changed as described in FIGS. 12A to 12F and 13 in the first embodiment.

The retention capacitor portion 80 is connected to the drain electrode 4a of the switching element 90 and the gate electrode 5b of the current driving element 90. Electric charges are accumulated in the retention capacitor part 90 through the drain electrode 4a of the switching element 70. Even after the switching element 70 is turned to the OFF state, the current driving element 90 is maintained at the ON state for a certain period of time by the electric charges accumulated in the retention capacitor part 90, The reason why the current supply line 17 and the current driving element 90 are provided as described above is that an amount of current required for making the emission pixel emit light is large. That is, the current supply line 17 for supplying current to the pixel electrode 10 is provided separately from the interconnections (data lines and gate lines) for switching the state of the display element 20.

Moreover, a shape of the current driving element 90 is devised so that it can flow a comparatively large current. The drain electrode 4b of the current driving element 90 projects in a rectangular shape to the side of the source electrode 3b on the opposite side of the pixel electrode 10. The source electrode 3b is formed in a concave shape so as to face both sides of the rectangular portion of the drain electrode 4b. The semiconductor layer 7b is so provided as to be connected to both the source electrode 3b and the both sides of the rectangular portion of the drain electrode 4b. The gate electrode 5b extends from the side of the retention capacitor 80 and the switching element 70 to the side of the current driving element 90 while branching to two and overlaps with the semiconductor layer 7b between the source electrode 3b and the drain electrode 4b. By devising the configurations of the source electrode 3b and the drain electrode 4b in this manner, an effective channel width can be doubled as compared with a case where one side of the source electrode 3b and one side of the drain electrode 4b face each other. As a result, the amount of current flowing through the current driving element 90 can be doubled.

Next, a layered structure of the display element 20 of the present embodiment will be explained referring to FIGS. 18 to 20.

As shown in FIGS. 18 to 20, the current supply line 17 is provided in the same layer as the data line 1-1. That is, it is provided on the insulating film 12.

As shown in FIG. 18, the retention capacitor portion 80 is constituted by a lower electrode 15, an upper electrode 16, the insulating films 12 and 14. The lower electrode 15 is so formed as to be in contact with the substrate 9. The upper electrode 16 is so provided as to overlap with the lower electrode 16 across the insulating film 12 and the insulating film 14. The retention capacitor is formed at a portion where the lower electrode 15 and the upper electrode 16 overlap.

The upper electrode 16 extends on the insulating film 14 up to the current supply line 17 and is connected to the current supply line 17 through an aperture provided in the insulating film 14.

The lower electrode 15 is connected with the drain electrode 4a of the switching element 70 through a through hole (not shown), although it is not illustrated.

Aluminum having a thickness of 0.2 [μm] is used as the lower electrode 17. A gold film having a thickness of 0.2 [μm] is stacked on a titanium film having a thickness of 0.01 [μm], which is used as the upper electrode 16. The lower electrode 16 is provided in the same layer as the gate electrode of the switching element 70 and the gate electrode 5b of the current driving element 90. Moreover, the upper electrode 16 is provided in the same layer as the source/drain electrodes of the switching element 70 and the source/drain electrodes (3b, 4b) of the current driving element 90.

The layered structure of the current driving element 90 will be explained referring to FIG. 19. As shown in FIG. 19, the first gate electrode 5b and the second gate electrode 6b are so provided on the substrate 9 as to be in contact with the substrate 9. Moreover, the insulating film 12 for isolating the first gate electrode 5b and the second gate electrode 6b is provided, and the current supply line 17 and the data line 1-1 are provided in the upper layer in the Z-direction. Furthermore, the insulating film 14 for isolating the current supply line 17 and the data line 1-1 is provided, and the source electrode 3b and the drain electrode 4b are provided in the upper layer in the Z-direction. Here, the drain electrode 4b is so provided as to be located right above the second gate electrode 6b through the insulating films 12 and 14. Moreover, the source electrode 3b strides over the data line 1-1 to be connected to the current supply line 17. The insulating film 14 isolates between the data line 1-1 and the source electrode 3b. Moreover, a length of the drain electrode 4b in the channel direction (in the X-direction) is smaller than a length of the second gate electrode 6b in the channel direction. Consequently, an electric field at the connection portion between the semiconductor layer 7b and the drain electrode 4b can be efficiently controlled by the second gate electrode 6b.

For example, each channel width, i.e., a width in the Y-direction at a portion where the source electrode 3b and the drain electrode 4b face each other (refer to FIG. 17) is 200 [μm]. A length of the gate electrode 5b in the channel direction (in the X-direction) is 40 [μm] and a thickness thereof is 0.2 [μm]. A length of the second gate electrode 5b in the channel direction is 20 [μm] and a thickness thereof is 0.2 [μm]. A length of the drain electrode 4b in the channel direction (in the X-direction) is 16 [μm]. An interval (X-direction) between the gate electrode 5b and the second gate electrode 6b is 20 [μm]. It is preferable that aluminum is used for both of the gate electrode 5b and the second gate electrode 6b.

A configuration of the connection portion between the second gate electrode 6b and the drain electrode 4b will be explained referring to FIG. 20. The second gate electrode 6b and the drain electrode 4b are connected through a through hole 21 provided in the insulating layers 12 and 14. Moreover, the pixel electrode 10 is formed on the protection film 11 and is connected to the drain electrode 4b through a through hole 22 provided in the protection film 11. Hole diameters of these through holes 21 and 22 are 10 [μm], for example. Although the through hole 21 for connecting the pixel electrode 10 and the drain electrode 4b and the through hole 22 for connecting the drain electrode 4b and the second gate electrode 6b are illustrated on the same position in FIG. 20, these may be provided at different positions.

In the display element 20 of the present embodiment, the switching element 70 is turned to be the conductive state by the voltage signal being supplied to the gate line 2-2, as in the case of the first embodiment. When a signal is supplied to the data line 1-1, the voltage of the gate electrode of the current driving element 90 is controlled through the switching element 70 in the conductive state. Thereby, the current driving element 90 is turned to be the conductive state. In addition, the retention capacitor 80 is charged. In the current driving element 90, a large current flows from the current supply line 17 to the pixel electrode 10. As a result, the light emitting element emits light. Even when the signal supply to the data line 2-2 is completed and the conductive state of the switching element 70 is finished, the conductive state of the current driving element 90 is maintained for a certain period of time by the electric charges accumulated in the retention capacitor 80.

Also in the present embodiment, in the switching element 70 and the current driving element 90, the second gate electrode (4a, 4b) controls an electric field at the interface portion between the semiconductor layer (7a, 7b) and the drain electrode (6a, 6b). Therefore, as in the first embodiment, a current tunneling from the side of the drain electrode (6a, 6b) to the side of the semiconductor layer (7a, 7b) can be suppressed. As a result, the off-leakage current can be reduced.

A method of manufacturing the current driving element 90 will be described below with reference to FIGS. 21A to 21G.

FIG. 21A

First, the Poly Ethylene Naphthalate (PEN) substrate, for example, of thickness 200 [μm] is prepared as the substrate 9. Then, aluminum is deposited on the substrate 9 by sputtering, and is patterned. Thereby, the first gate electrode 5b and the second gate electrode 6b are formed. Patterning of aluminum can be performed by pattern-forming the mask resist using common lithography and wet-etching it. As the etchants, an aqueous solution of at least one kind of phosphoric acid, nitric acid, and acetic acid can be enumerated, for example. Moreover, an alkali developing solution of the positive resist for optical lithography and the like can be used as an etchant.

Moreover, the first gate electrode 5b and the second gate electrode 6b may be formed by another technique. For example, first, resist that is patterned so that formation scheduled regions of the first gate electrode 5b and the second gate electrode 6b are opened is formed by lithography. Then, aluminum is deposited to form a film. For formation of aluminum, a deposition method that introduces strong anisotropy, such as vapor deposition, is preferable. After that, aluminum of the unnecessary portion is removed together with the resist using a solvent that dissolves the resist.

FIG. 21B

Next, the insulating film 12 is formed. Specifically, a silicon nitride film is formed by sputtering. Silicon nitride is used as a target, and argon gas is used as a gas of plasma. In order to improve the quality of the film, nitrogen of 20 sccm is also introduced simultaneously. Pressure is 2 Pa. Its film thickness is 0.4 [μm]. After the formation of the insulating film 12, the data line 1-1 and the current supply line 17 are formed. The data line 1-1 and the current supply line 17 can be formed by a same process as that of the gate electrode.

FIG. 21C

Next the insulating film 14 is formed. The insulating film 14 can be formed by a same process as that of the insulating film 12. Incidentally, before the formation of the insulating film 14, the insulating film 12 on the first gate electrode 5b and the second gate electrode 6b is selectively removed by etching. A reason to remove it is to prevent the gate controllability from decreasing since if the insulating layer 12 is left as it is and the insulating layer 14 is layered thereon, the gate insulating layer will become thick to decrease it. Although it may be removed completely, since a same film is formed later, it is satisfactory even if the insulating layer 12 remains by about a few 10 nm. What is necessary in order to selectively etch and remove the insulating film 12 is just to use photoresist that is subjected to pattern formation by general lithography as a mask.

FIG. 21D

Next, the source electrode 3b and the drain electrode 4b are formed. Specifically, after forming the photoresist whose pattern is formed by optical lithography, gold is deposited to form a film by vapor deposition. Then, the gold film of the unnecessary portion is removed together with the photoresist by liftoff.

As other techniques for forming the source electrode 3b and the drain electrode 4b, a technique that is generally used in a manufacture method of a usual semiconductor device can also be used. For example, metal for formation of the source electrode 3b and the drain electrode 4b is first formed over the whole surface of the insulating film 14. Then the resist patterned using lithography is formed. Furthermore, etching is performed using this resist as a mask. Alternatively, as a further another technique, the method of printing the electrically conductive ink is also usable.

FIG. 21E

Next, the semiconductor layer 7b is formed. The semiconductor layer 7b can be formed by spin coating a dichloroethane solution of CNT and removing an unnecessary portion. Specifically, first, a solution in which CNT is dissolved in dichloroethane is prepared. In adjusting the solution, it is adjusted so that the concentration of CNT may become about $1 \times 10^{-6}$ by a weight ratio. Further specifically, first, CNT of 1 [mg] is dissolved in dichloroethane of 100 [ml]. This is dispersed ultrasonically for about one hour. Next, 3 [ml] is picked from this CNT solution, and is diluted with dichloroethane of 27 [ml]. Thereby, this becomes a CNT solution of a concentration of about $1 \times 10^{-6}$ by a weight ratio. Further, this solution is subjected to an ultrasonic treatment for one hour using a commercial ultrasonic homogenizer to disperse CNT. A solution in which CNT is dispersed is spin-coated on the substrate. In doing the spin coating, the CNT solution that was adjusted is dropped on the substrate by about 40 [μl], and the substrate is rotated at about 800 [rpm] for about 10 seconds.

Although the density of CNT differs according to a surface state of the substrate, it becomes a density of about 0.6 pieces/[μm]2 by a spin coating process of four or five times. The density of CNT can be adjusted by the number of times of the spin coating process. In removing CNT of the unnecessary portion, a silicon nitride film patterned as a mask is formed and CNT is removed by oxygen ashing. The silicon nitride film for the mask is formed by sputtering, and is patterned by optical lithography.

Moreover, in removing CNT of the unnecessary portion, it is also possible to use the liftoff method. That is, resist that is opened only in a formation-scheduled region of the semiconductor layer 7 is formed by lithography. After that, CNT is spin-coated. Subsequently, CNT of the unnecessary portion is removed together with the resist by a resist solvent.

Moreover, in film formation of CNT, methods other than the spin coating can also be used. For example, a method of pulling up a substrate after immersing it in a CNT solution and drying it, a method of dropping a CNT solution only in a region where the semiconductor layer 7 is scheduled to be formed with the dispenser (the injection syringe), a method of using an ink-jet printing machine, etc. may be used. Incidentally, when adopting the method of pulling up the substrate after immersing it, since CNT adheres to the whole surface of the substrate, a process of selectively removing CNT of the unnecessary portion, like the spin coating method, is required.

FIG. 21F

Next, the protection film 11 is formed. The protection film 11 is formed by sputtering a silicon nitride film.

In film formation of the insulating layers 12, 14 and the protection film 11, any techniques other than the techniques already described, other than what was mentioned above may be used. For example, the vapor deposition method, the heat phase growth method, the method of heating and activating an organic insulating layer and depositing it, etc. may be used.

FIG. 21G

Next, the pixel electrode 10 is formed. Specifically, before depositing a metal for formation of the pixel electrode 10 to form a film, the through hole 21 is formed in the protection film 11 on the drain electrode 5b. The through hole 21 is formed by forming the resist that is patterned by lithography, and subsequently dry etching the protection film 11. Then, the resist that is a mask is peeled off and the metal (ITO) for the pixel electrode 10 is deposited to form a film over the whole surface by sputtering. Then, the resist of the pattern from which an unnecessary portion was removed is formed by lithography, and ITO formed on the unnecessary portion is removed by wet etching.

As mentioned above, the current driving element 90 is manufactured by the processes shown in FIGS. 21A to 21G. Note that the materials explained in the present embodiment are just one example, and as explained in the first embodiment, it is possible to substitute another material for the each material.

According to the present embodiment, it is possible to obtain the same action as explained in the first embodiment, with respect to the display element that requires a large current.

Third Embodiment

Figure 22:
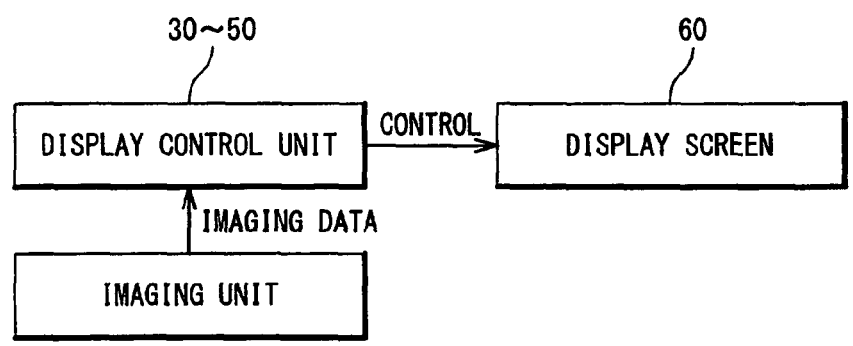
FIG. 22 is a schematic configuration diagram showing a configuration of a video camera using the display device of the present invention.

The present embodiment is a video camera which uses a display screen 60 having the display elements 20 described in the foregoing embodiments. FIG. 22 is a block diagram showing a configuration of the video camera of the present embodiment. The video camera has an imaging unit, a display control unit (30 to 50) and the display screen 60. The display control unit (30 to 50) corresponds to the control unit 50, the gate line driving circuit 40 and the data line driving circuit 30 explained in the foregoing embodiments. The display screen 60 uses the display elements 20 and corresponds to the display screen 60 explained in the foregoing embodiments (refer to FIG. 3). The imaging unit has a camera for imaging an image and transfers an image data acquired by the camera to the display control unit (30 to 50). The display control unit (30 to 50) controls the display screen 60 based on the acquired image data such that the image is displayed on the display screen 60.

Fourth Embodiment

Figure 23:
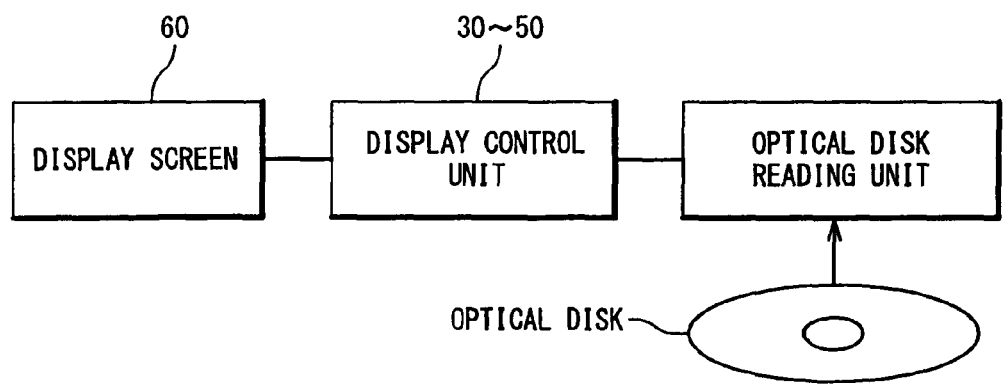
FIG. 23 is a schematic configuration diagram showing a configuration of an optical disk reproducing device using the display device of the present invention.

The present embodiment is an optical disk reproducing device which uses a display screen 60 having the display elements 20 described in the foregoing embodiments. FIG. 23 is a block diagram showing a configuration of the optical disk reproducing device of the present embodiment. The optical disk reproducing device has an optical disk reading unit, a display control unit (30 to 50) and the display screen 60. The display control unit (30 to 50) corresponds to the control unit 50, the gate line driving circuit 40 and the data driving circuit 30 explained in the foregoing embodiments. The display screen 60 uses the display elements 20 and corresponds to the display screen 60 explained in the foregoing embodiments (refer to FIG. 3). The optical disk reading unit reads data recorded on an optical disk and transfers the read data to the display control unit (30 to 50). The display control unit (30 to 50) controls the display screen 60 based on the acquired read data such that the image is displayed on the display screen 60.

Fifth Embodiment

Figure 24:
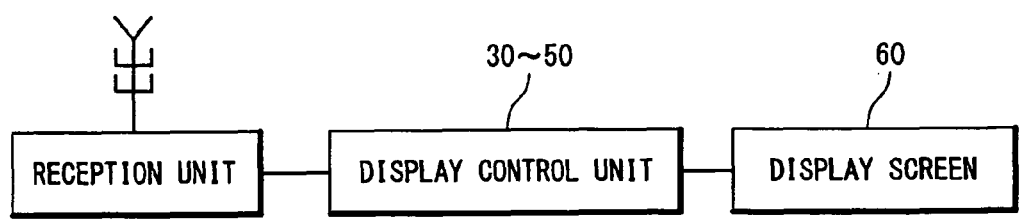
FIG. 24 is a schematic configuration diagram showing a configuration of a television receiver using the display device of the present invention.

The present embodiment is a television receiver which uses a display screen 60 having the display elements 20 described in the foregoing embodiments. FIG. 24 is a block diagram showing a configuration of the television receiver of the present embodiment. This television receiver has a reception unit, a display control unit (30 to 50) and the display screen 60. The display control unit (30 to 50) corresponds to the control unit 50, the gate line driving circuit 40 and the data driving circuit 30 explained in the foregoing embodiments. The display screen 60 uses the display elements 20 and corresponds to the display screen 60 explained in the foregoing embodiments (refer to FIG. 3). The reception unit has an antenna and receives a radio signal of television image. The reception unit transfers the reception data received through the antenna to the display control unit (30 to 50). The display control unit (30 to 50) controls the display screen 60 based on the acquired reception data such that the image is displayed on the display screen 60.

Sixth Embodiment

Figure 25:
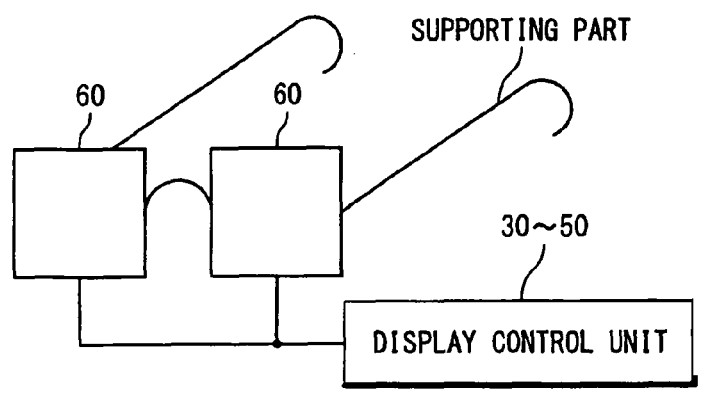
FIG. 25 is a schematic configuration diagram showing a configuration of a head mounted display using the display device of the present invention.

The present embodiment is a head mounted display which uses a display screen 60 having the display elements 20 described in the foregoing embodiments. FIG. 25 is a diagram schematically showing a configuration of the head mounted display of the present embodiment. This head mounted display has a supporting part, a display control unit (30 to 50) and the display screen 60. The display control unit (30 to 50) corresponds to the control unit 50, the gate line driving circuit 40 and the data driving circuit 30 explained in the foregoing embodiments. The display screen 60 uses the display elements 20 and corresponds to the display screen 60 explained in the foregoing embodiments (refer to FIG. 3). The supporting part supports the display screen 60. When used, the supporting part supports the display screen 60 such that the display screen 60 is positioned in front of eyes of a user.

In the foregoing, although embodiments of the present invention have been described in detail, a concrete configuration is not restricted to the above-mentioned embodiments and any embodiment will be included in the present invention even if there is alteration in a range that doses not deviate from the gist of the present invention.

The invention claimed is:

1. A field-effect type transistor comprising:
a source electrode;
a drain electrode being a metal electrode;
a semiconductor layer provided between said source electrode and said drain electrode in an X-direction and being in contact with both of said source electrode and said drain electrode; and
a gate electrode provided to face at least a part of said semiconductor layer in a Z-direction perpendicular to said X-direction,
wherein said gate electrode comprises:
a first gate electrode; and
a second gate electrode provided closer to said drain electrode in said X-direction than said first gate electrode is,
wherein an end portion of the first gate electrode on a side of the drain electrode is provided at a position facing a central portion of a channel region formed in said semiconductor layer, said second gate electrode is so connected as to have a same potential as said drain electrode and is electrically isolated from said first gate electrode, and at least a part of said second gate electrodes is so provided as to face in said Z-direction a connection portion between said semiconductor layer and said drain electrode.

2. The field-effect type transistor according to claim 1, wherein said source electrode comprises a rectangular portion, and said drain electrode is so provided as to surround at least two sides of said rectangular portion.

3. The field-effect type transistor according to claim 1, wherein said semiconductor layer includes carbon nanotubes.

4. A display element comprising:
the field-effect type transistor according to claim 1; and
a pixel electrode electrically connected to said drain electrode.

5. The display element according to claim 4, wherein said pixel electrode comprises a liquid crystal electrode.

6. The display element according to claim 4, wherein said pixel electrode comprises an EL (electroluminescence) element.

7. A display element comprising:
a switching transistor;
a current driving transistor; and
a pixel electrode connected to a drain electrode of said current driving transistor,
wherein a drain electrode of said switching transistor is electrically connected to a gate electrode of said current driving transistor, and
wherein at least one of said switching transistor and said current driving transistor is the field-effect type transistor according to claim 1.

8. The display element according to claim 7, wherein a source electrode of said switching transistor is electrically connected to a data line, and a source electrode of said current driving transistor is connected to a current supply line different from said data line.

9. A video camera comprising:

an imaging unit;

a display screen; and a display control unit configured to control such that an image data acquired by said imaging unit is displayed on said display screen, wherein in said display screen, a plural number of the display elements according to claim 4 are arranged in a grid form.

10. An optical disk reproducing device comprising:

an optical disk reading unit configured to read information recorded on an optical disk;

a display screen; and a display control unit configured to control such that the information read by said optical disk reading unit is displayed on said display screen, wherein in said display screen, a plural number of the display elements according to claim 4 are arranged in a grid form.

11. A television receiver comprising: a reception unit configured to receive a television video signal;

a display screen; and a display control unit configured to control contents displayed on said display screen based on said television video signal received by said reception unit, wherein in said display screen, a plural number of the display elements according to claim 4 are arranged in a grid form.

12. A head mounted display comprising:

a display screen;

a supporting part configured to support said display screen such that, when used, said display screen is positioned in front of eyes of a user; and a display control unit configured to control contents displayed on said display screen, wherein in said display screen, a plural number of the display elements according to claim 4 are arranged in a grid form.

13. An apparatus comprising at least one display device, at least one said display device comprising a plurality of field-effect type transistors arranged in a grid form, each said field-effect type transistor comprising:

a source electrode;

a drain electrode being a metal electrode;

a semiconductor layer provided between said source electrode and said drain electrode in an X-direction and being in contact with both of said source electrode and said drain electrode; and a gate electrode provided to face at least a part of said semiconductor layer in a Z-direction perpendicular to said X-direction, wherein said gate electrode comprises:

a first gate electrode; and a second gate electrode provided closer to said drain electrode in said X-direction than is said first gate electrode, wherein an end portion of the first gate electrode on a side of the drain electrode is provided at a position facing a central portion of a channel region formed in said semiconductor layer, said second gate electrode is so connected as to have a same potential as said drain electrode and is electrically isolated from said first gate electrode, and at least a part of said second gate electrodes is so provided as to face in said Z-direction a connection portion between said semiconductor layer and said drain electrode.

14. The apparatus of claim 13, said apparatus comprising one of:

a video camera;

an optical disk reproducing device;

a television receiver; and a head mounted display.

* * * * *